US010971918B2

(12) United States Patent
Kurniawan

(10) Patent No.: US 10,971,918 B2
(45) Date of Patent: Apr. 6, 2021

(54) AUTOMATED GROUND FAULT INTERRUPTOR

(71) Applicant: Arconas Corporation, Mississauga (CA)

(72) Inventor: Albert Mardianto Kurniawan, Hamilton (CA)

(73) Assignee: ARCONAS CORPORATION, Mississauga (CA)

(*) Notice: Subject to any disclaimer, the term of this patent is extended or adjusted under 35 U.S.C. 154(b) by 433 days.

(21) Appl. No.: 15/917,593

(22) Filed: Mar. 10, 2018

(65) Prior Publication Data
US 2018/0261993 A1 Sep. 13, 2018

Related U.S. Application Data

(60) Provisional application No. 62/469,910, filed on Mar. 10, 2017.

(51) Int. Cl.
H02H 3/06 (2006.01)
H02H 3/16 (2006.01)
(Continued)

(52) U.S. Cl.
CPC .......... H02H 3/066 (2013.01); G01R 19/10 (2013.01); G01R 31/50 (2020.01); H02H 1/0007 (2013.01); H02H 3/05 (2013.01); H02H 3/162 (2013.01); H02H 3/33 (2013.01); H05K 5/0217 (2013.01); H05K 5/0278 (2013.01); H01H 83/04 (2013.01); H02H 3/335 (2013.01)

(58) Field of Classification Search
USPC ......................................................... 361/42
See application file for complete search history.

(56) References Cited

U.S. PATENT DOCUMENTS 6,262,871 B1 * 7/2001 Nemir .................. G01R 31/327
324/424
6,807,036 B2 * 10/2004 Baldwin ................ H02H 3/335
361/42

(Continued)

OTHER PUBLICATIONS

"Self Test with Lockout Ground Fault Circuit Interrupter", Semiconductor Components Industries, LLC, 2014, Oct. 2014—Rev. 1, Publication Order No. NCP37010/D, 12 pages.
(Continued)

Primary Examiner — Danny Nguyen
(74) Attorney, Agent, or Firm — Westman, Champlin & Koehler, P.A.

(57) ABSTRACT

In accordance with example embodiments, an automated ground fault interrupter includes means for resetting itself following detection of a ground fault. In accordance with example embodiments, when a ground fault is detected, a relay switch opens and breaks the conducting path between an AC input and a plug for connecting devices for a set amount of time after which the relay switch is closed again, restoring the conducting path between the plug and the AC input. Following restoration of the conducting path, the relay switch is opened again if a ground fault is detected. In accordance with example embodiments, the automated ground fault interrupter automatically tests itself at predetermined intervals. In accordance with example embodiments, the ground fault interrupter is automatically reset following the automatic test.

15 Claims, 18 Drawing Sheets

(51) Int. Cl.
*H02H 1/00* (2006.01)
*G01R 19/10* (2006.01)
*H05K 5/02* (2006.01)
*H02H 3/05* (2006.01)
*H02H 3/33* (2006.01)
*G01R 31/50* (2020.01)
*H01H 83/04* (2006.01)

(56) References Cited

U.S. PATENT DOCUMENTS

2007/0030608 A1* 2/2007 Baldwin ............... H02H 3/335
361/42
2014/0098446 A1* 4/2014 Aromin ................. H02H 3/16
361/42

OTHER PUBLICATIONS

"TPS25740EVM-741 and TPS25740AEVM-741 Evaluation Module User Guide", Texas Instruments Incorporated, User's Guide, SLVUAP7A—Apr. 2016—Revised Sep. 2016, 31 pages.
"TPS25740, TPS25740A USB Type-C and USP PD Source Controller", Texas Instruments Incorporated, SLVSDG8A—Apr. 2016—Revised May 2016, 64 pages.

* cited by examiner

AUTOMATED GROUND FAULT INTERRUPTOR

CROSS-REFERENCE

This application claims the benefit of priority to U.S. Provisional Patent Application No. 62/469,910 filed Mar. 10, 2017, the contents of which are herein incorporated by reference into the DETAILED DESCRIPTION OF EXAMPLE EMBODIMENTS herein below.

FIELD

Example embodiments relate generally to the field of ground fault interrupters and in particular to ground fault interrupters with automatic tests and automatic resets.

BACKGROUND

A ground fault occurs in alternating current (AC) circuits when there is accidental contact between a live conductor or other conductor and ground. Examples of occasions where ground faults may occur include a failure in a conductor's insulation, a non-insulated conductor becoming dislodged, accidental submersion of a circuit in water, or other inadvertent contact between a live and grounded conductor. Ground faults may pose a safety risk to individuals as a result of electric shock if they come into contact with a live conductor.

Ground fault interrupters, sometimes referred to as ground fault circuit interrupters, residual-current devices, or residual-current circuit breakers, were designed to automatically break the conducting path between a power supply and a circuit when a ground fault is detected. In typical operation, the live and neutral conductors from the power supply will carry matching currents. A difference in current between the live and neutral conductors indicates that current is leaking in the circuit, which may be the result of a ground fault. When a ground fault interrupter detects a current difference above a certain threshold between the live and neutral conductors or conductors, it breaks the connecting path between the power supply and the circuit.

Ground fault interrupters often have a manual reset switch. Manual reset ground fault interrupters are quite useful in many applications, including for example residential applications. However, in public spaces that contain numerous receptacles, manual reset ground fault interrupters can cause inconvenience and also be prone to breakage after a number of manual rests.

SUMMARY OF INVENTION

In accordance with example embodiments, an automated ground fault interrupter includes means for resetting itself following detection of a ground fault. In accordance with example embodiments, when a ground fault is detected, a relay switch opens and breaks the conducting path between an AC input and a plug for connecting devices for a set amount of time after which the relay switch is closed again, restoring the conducting path between the plug and the AC input. Following restoration of the conducting path, the relay switch is opened again if a ground fault is detected. In accordance with example embodiments, the automated ground fault interrupter automatically tests itself at predetermined intervals. In accordance with example embodiments, the ground fault interrupter is automatically reset following the automatic test.

In accordance with example embodiments, a power supply unit comprises a main power input for connecting to an AC power source; a power output for providing AC power; live and neutral conductive paths connecting the power input to the power output, including a relay between the power input and power output; a current sensor for sensing a differential current between the live and neutral conductive paths; and control circuitry operatively connected to the relay and the current sensor, the control circuitry being configured to: upon detecting that the differential current between the live and neutral conductive paths exceeds a threshold, cause the relay to stop current flow from the main power input to the power output for a first predetermined duration after which the relay automatically allows current flow from the main power input to the power output to resume.

In accordance with example embodiments, the control circuitry is further configured to: generate a differential current between the live and neutral conductive paths at a predetermined interval by grounding the live conductive path; identify a failure if a differential current is not detected after the differential current is generated; and signal a failure if a failure is identified.

In accordance with example embodiments, the power supply unit further comprises: a rigid casing; one or more openings in the rigid case; and one or more modular inserts that can be fitted into corresponding openings; wherein the modular inserts support different plug receptacle configurations and are in electric communication with the power output when inserted into corresponding openings.

In accordance with example embodiments, a ground fault interrupter comprises a main input and a main output connected by a live conductor and a neutral conductor; a normally open relay between the main input and the main output which uses a solenoid to operate a switch on at least the live conductor; a ground fault detector connected to the live conductor and neutral conductor between the relay and the main output which detects ground fault conditions in the live conductor and neutral conductor and provides an output to indicate when a ground fault condition has been detected; and a delay circuit connected to the output of the ground fault detector and the solenoid, which stops current flow to the solenoid when the output of the ground fault detector indicates a ground fault condition has been detected, and allows current flow to the solenoid after a delay when the output of the ground fault detector changes from indicating a ground fault condition to indicating no ground fault condition.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

In accordance with example embodiments, an automated ground fault interrupter includes means for resetting itself following detection of a ground fault. In accordance with example embodiments, an automated ground fault interrupter includes a means for automatically testing itself at predetermined intervals.

Figure 1:
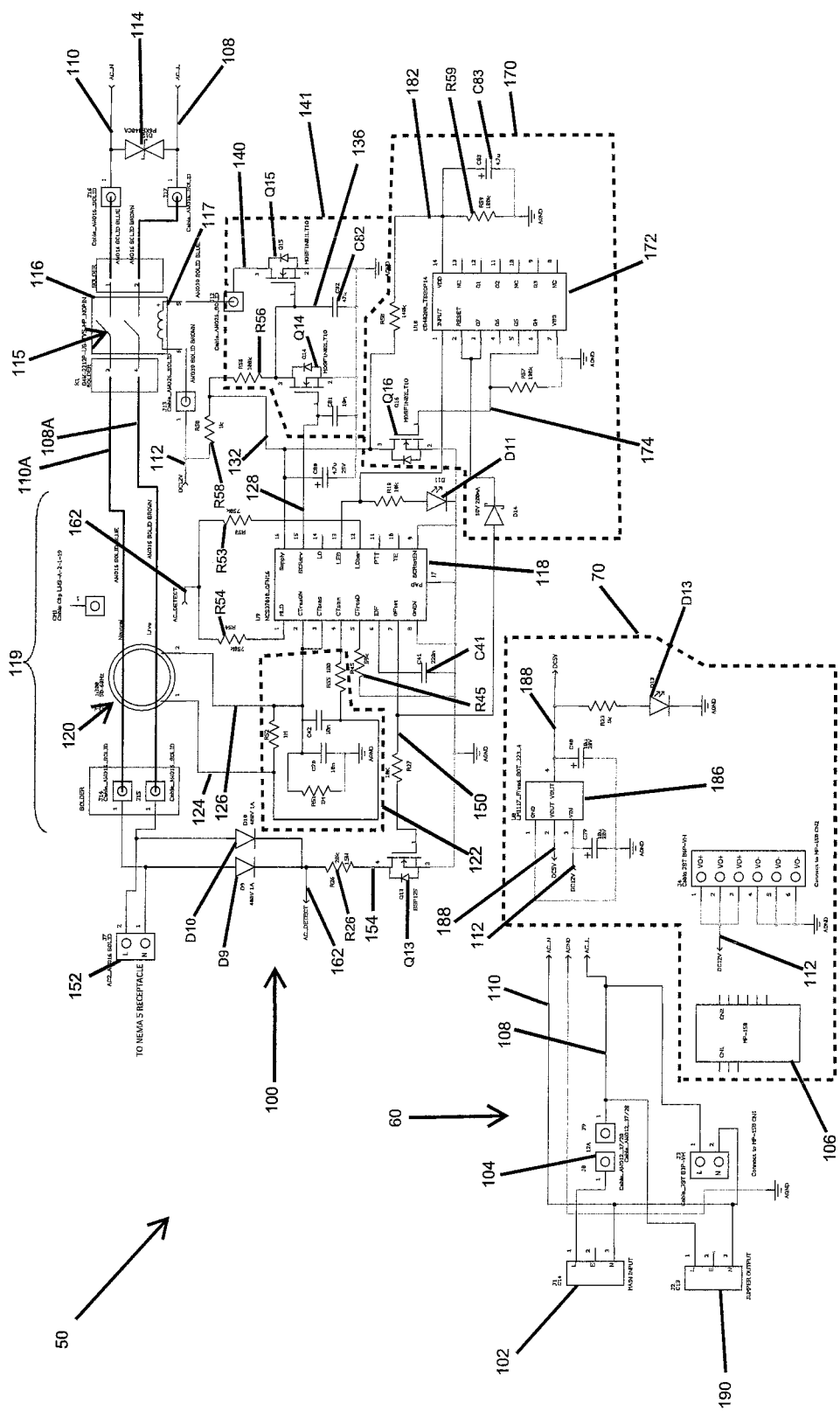
FIG. 1 is an electrical schematic for components of a power supply unit that includes an automatic ground fault interrupter containing a ground fault interrupter chip in accordance with an example embodiment.
Figure 11:
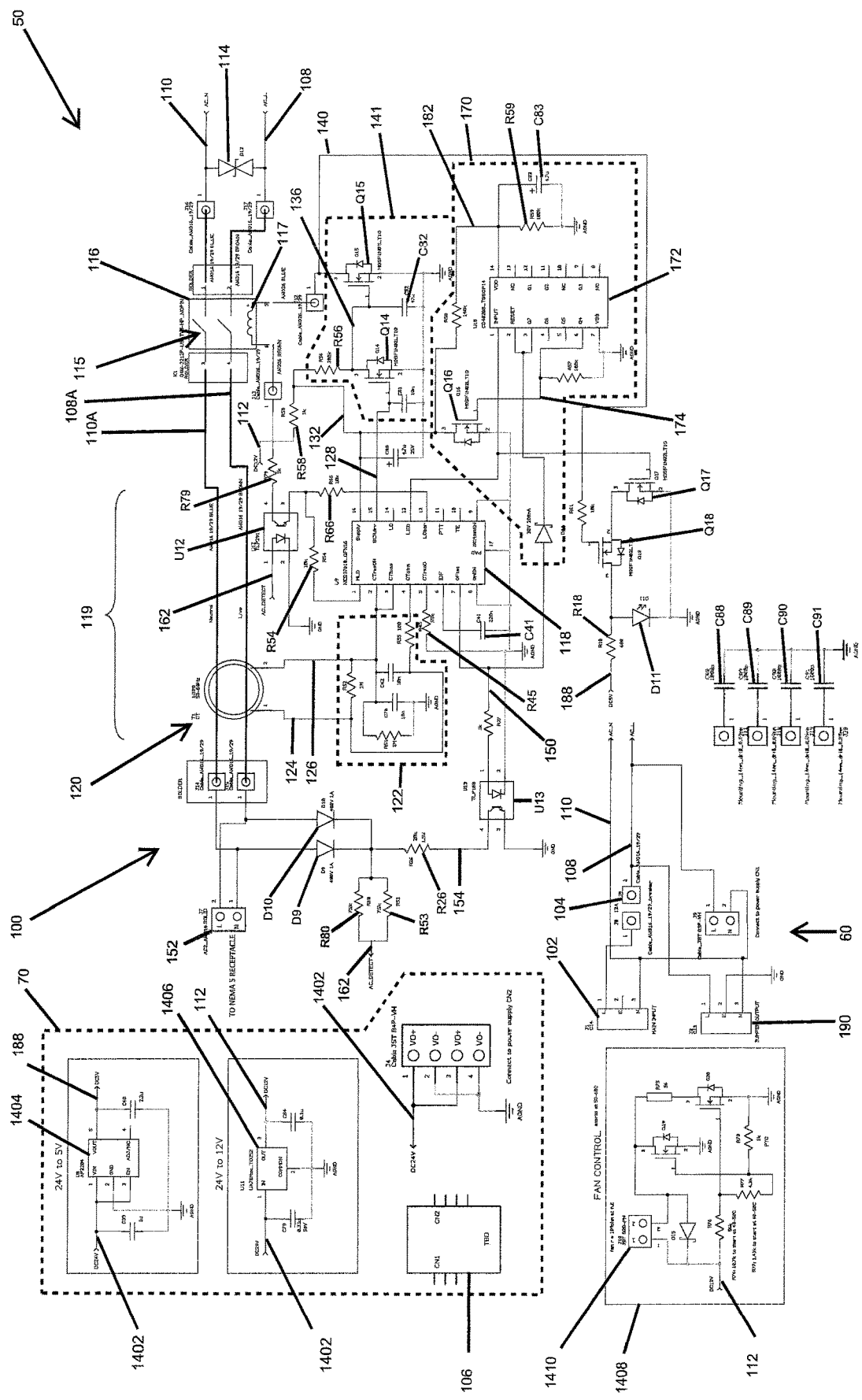
FIG. 11 is an electrical schematic for components of a power supply unit that includes an automatic ground fault interrupter containing a ground fault interrupter chip in accordance with an example embodiment.

FIGS. 1 and 11 illustrate components of a power supply unit 50 according to example embodiments, including: an automated ground fault interrupter (GFI) circuit 100, an AC power connection circuit 60, and an AC to DC power supply circuit 70. As shown in FIG. 1, in accordance with example embodiments, the automated GFI circuit 100 is connected to an AC power supply through a main power input 102 of the AC power connection circuit 60. In accordance with example embodiments, the main input 102 is connected to an electrical grid through a three prong receptacle, or alternatively the main input 102 can be wired directly into the electrical grid. In accordance with some example embodiments, the main input 102 is connected to an AC generator.

In accordance with example embodiments, the AC power connection circuit 60 is configured to connect power supply unit 50 to an external 110V AC power source, or in some examples, a 220V AC power source. In at least some configurations, the main input 102 of the AC power connection circuit 60 can be interchangeably connected to a 110V or 220V power source.

The main input 102 provides electrical connections between the external and a live conductor 108 and a neutral conductor 110 of the power supply unit 50. In accordance with example embodiments, references to conductors can refer to any appropriate conductive line, including a route or track on a printed circuit board (PCB), a wire, a power bus, and combinations thereof with intermediate connectors.

In accordance with example embodiments, live conductor 108 and neutral conductor 110 extend from the AC power connection circuit 60 to GFI circuit 100 and are connected to the inputs of a relay 116 of the GFI circuit 100. The respective outputs of relay 116 are connected by respective live conductor 108A and neutral conductor 110A to a main output 152 of the GFI circuit 100. In accordance with example embodiments, the main output 152 is connected to one or more AC receptacles 404, 406, 702, and 704 (described below) which can be used to connect a user device to the GFI circuit 100. In accordance with example embodiments, the GFI circuit 100 is designed to monitor for and react to ground faults in the connected device.

In accordance with example embodiments, the AC power connection circuit 60 includes a breaker 104 on the live conductor 108 at a location between the relay 116 and the main power input 102. The breaker 104 is configured to trip and cause an open circuit in live conductor 108, cutting off all power to the power supply unit 50, in the event that the current travelling through the live conductor 108 exceeds a trip threshold. In one example, the trip threshold for breaker 104 is 12 Amps, although different thresholds may be used in different operating environments. In example embodiments, once tripped, breaker 104 requires a manual reset in order to allow the ground fault interrupter 100 to resume operation. In accordance with some example embodiments, a fuse is used instead of a breaker 104.

In accordance with example embodiments, the AC to DC power supply circuit 70 includes an AC to DC (direct current) power supply 106 that is used to provide local DC power required for operation of the components of power supply unit 50 and also to provide a DC power source for any DC USB power outlet ports 222, 322 (described below) that may be included as part of the power supply unit 50. AC to DC power supply 106 is connected to the live and neutral conductors 108, 110 of the AC power connection circuit 60 (on the load-side of breaker 104).

As understood by a skilled person, a number of different AC to DC power supplies are available that can provide different voltage and current ranges. As shown in FIG. 1, in accordance with example embodiments the AC to DC power supply 106 provides a voltage output of 12V DC. In accordance with example embodiments, the AC to DC power supply 106 provides 12V DC and up to 100 W of power to the circuit. In accordance with example embodiments, the AC to DC power supply 106 provides 12V DC and up to 150 W of power to the circuit. Examples of power supplies include the MP-150 series by Cotek™ and the HBU100 series by Sinpro™. In accordance with example embodiments, the AC to DC power supply 106 powers a 12V DC conductor 112 that distributes DC power throughout the power supply unit 50.

As shown in FIG. 11, in accordance with example embodiments, the AC to DC power supply 106 provides a voltage output of 24V DC. In accordance with example embodiments, the AC to DC power supply 106 powers a 24V DC conductor 1402 that distributes DC power throughout the power supply unit 50. In accordance with example embodiments, the AC to DC power supply 106 provides 24V DC and up to 150 W of power to the circuit. Examples of power supplies include the EPP-150-24 series by MeanWell™

In accordance with example embodiments, a surge protector 114 is connected at an AC power input of the GFI circuit 100 between the live conductor 108 and neutral conductor 110. The surge protector 114 is configured to limit the maximum voltage between the live conductor 108 and neutral conductor 110 by shorting to ground any voltage over a desired threshold. Examples of surge protectors include the RV431K10T voltage suppressors.

As noted above, the GFI circuit 100 includes a relay 116 between power supply side live and neutral conductors 108, 110 and load side live and neutral conductors 108A, 110A. In accordance with example embodiments, relay 116 is configured to break the conducting path between the main output 152 and the main input 102 when a ground fault is detected by GFI circuit 100. As shown in FIG. 1, in accordance with example embodiments, the relay 116 is a normally open double pole single throw relay 116, which is able to close respective switches 115 between live conductors 108 and 108A and neutral conductors 110 and 110A when restoring the conducting path between the main input 102 to the main output 152, and open the switches 115 when breaking the conducting path between the main input 102 and the main output 152. Examples of double pole single throw relays include the G4W-2212P-US-TV5-HP-DC12 General Purpose Relay by Omron Electronics Inc. In accordance with some example embodiments, normally open double pole single throw relay 116 may be replaced with a normally open single pole single throw relay 116 which only opens and closes a switch between live conductors 108 and 108A.

In accordance with example embodiments, use of a double pole single throw relay 116 allows the system to operate with any polarity. In accordance with example embodiments, the live conductors 108 and 108A can function as neutral conductors and the neutral conductors 110 and 110A can function as live conductors in a system which can operate with any polarity.

Relay 116 is controlled by a solenoid 117 that is connected to receive current from the 12V DC conductor 112. In accordance with example embodiments, the normally open relay 116 closes the switches 115 when its solenoid 117 receives a current and opens the switches 115 when its solenoid 117 does not receive a current.

As will be explained in greater detail below, the current to the relay's 116 solenoid 117 is controlled by a delay circuit 141 which receives an input from a ground fault detector 119 when a ground fault condition is detected. In accordance with example embodiments, the delay circuit 141 stops current flow to the relay's 116 solenoid when the output of the ground fault detector indicates a ground fault condition has been detected, and allows current flow to the relay's solenoid 117 after a delay when the output of the ground fault detector changes from indicating a ground fault condition to indicating no ground fault condition.

In accordance with example embodiments, the ground fault detector 119 is implemented using a current sensor in the form of a differential current transformer 120, and a GFI controller 118 in the form of ground fault interrupter self-test chip (GFI chip). In accordance with example embodiments, the ground fault detector 119 includes a filter 122 between the transformer 120 and the GFI controller 118 to reduce the noise that may exist in the circuit. One example of a GFI controller 118 is the self test with lockout ground fault circuit interrupter NCS37010 by ON Semiconductor™. In some alternative embodiments, a self-test ground fault interrupter circuit is used instead of a GFI chip to implement the GFI controller.

In accordance with example embodiments, the GFI controller 118 receives power from the 12V DC conductor 112 from the AC to DC power supply circuit 70. In accordance with example embodiments, resistor R58 is used to reduce the voltage in GFI controller 118 supply conductor 132 from the 12V DC conductor 112 to an appropriate voltage for the GFI controller 118. In accordance with example embodiments, an appropriate voltage is determined based on the GFI controller's 118 manufacturer's specifications. In accordance with example embodiments, the resistor R58 is used to reduce the voltage in the GFI controller 118 supply conductor 132 to approximately 6V. In accordance with example embodiments, resistor R58 is approximately 1 kΩ.

In accordance with example embodiments, the GFI controller 118 detects whether there is a current above a trip level between the differential transformer's 120 first output conductor 124 and second output conductor 126.

In accordance with example embodiments, the live conductor 108A and neutral conductor 110B pass through transformer 120 such that the current in the live conductor 108A creates an opposite magnetic field to the neutral conductor 110A in the transformer 120. In some examples, the portions of the conductors 108A and 110A that pass through the transformer 120 are physical wires. When the live conductor 108A and the neutral conductor 110A have the same current, their magnetic fields in the transformer 120 cancel out, and no current is induced in the transformer's 120 first output conductor 124 and second output conductor 126. Any difference in the current of the live conductor 108A and the neutral conductor 110A will induce a differential current between the transformer's 120 first output conductor 124 and second output conductor 126.

In accordance with example embodiments the transformer 120 has a turn ratio between 200 and 300. In accordance with example embodiments, a transformer 120 with different ratios can be used to adjust the current detection sensitivity of the GFI controller 118.

In accordance with example embodiments, a filter 122 is applied to the transformer's 120 first output conductor 124 and second output conductor 126 to reduce the noise that may exist in the circuit as a result of the connected device as well as adjust the detection sensitivity and threshold of the GFI controller 118. In accordance with example embodiments, the filter 122 reduces the likelihood of detecting a false ground fault as a result of circuit noise. In accordance with example embodiments, the filter 122 is a standard first degree filter.

In accordance with example embodiments, resistor R45 is selected to adjust the trip level of the GFI controller 118. In accordance with example embodiments, capacitor C41 is selected to adjust the trip sensitivity of the GFI controller 118. In accordance with example embodiments, resistor R45 and capacitor C41 are selected in accordance with the GFI controller 118 chip manufacturer's specifications.

In accordance with example embodiments, the filter 122 is designed and the transformer 120, resistor R45 and capacitor C41 are selected such that the trip level for the GFI controller 118 corresponds to approximately 5.5 mA current difference between live conductor 108 and neutral conductor 110. In accordance with example embodiments, the trip level for the GFI controller 118 is set to correspond to approximately 11 mA current difference between the live conductor 108 and neutral conductor 110. In accordance with example embodiments, a 5.5 mA current difference is used when the AC power supply is 110V and an 11 mA current difference is used when the AC power supply is 220V.

In accordance with example embodiments, a ground fault condition is detected by the GFI controller 118 when the transformer's 120 first output conductor 124 and second output conductor 126 exceed the trip level. When the GFI controller 118 detects a ground fault condition, a logic high voltage is output to fault output conductor 128. In accordance with example embodiments, the logic high voltage approximately matches the voltage of the GFI controller 118 supply conductor 132, which may for example be approximately 6V. In accordance with example embodiments, the logic high voltage is in accordance with the GFI controller 118 chip manufacturer's specifications.

Providing a logic high voltage to fault output conductor 128 begins a ground fault procedure that includes opening the relay 116, which breaks the conducting path between the main output 152 and the main input 102, for a set amount of time after which the relay 116 is automatically closed again, which restores the conducting path between the main output 152 to the main input 102.

In example embodiments, the logic high voltage is provided to a delay circuit 141 which opens the relay 116 when a fault condition is detected and keeps the relay 116 open a set amount of time after a ground fault condition is detected. In example embodiments, the logic high voltage in fault output conductor 128 turns on transistor Q14, which connects trip conductor 136 to ground. When trip conductor 136 is connected to ground, transistor Q15 is turned off, disconnecting solenoid conductor 140 from ground, thereby stopping current from flowing through solenoid conductor 140 and turning off the relay 116. Examples of appropriate transistors include the MGSF1N02L MOSFET transistor. In accordance with example embodiments, turning off the relay 116 opens the switches on live conductors 108/108B and neutral conductors 110/110B, breaking the conducting path between the main output 152 and the main input 102.

When the relay 116 opens, current no longer flows through the live conductor 108A or the neutral conductor 110A. In accordance with example embodiments, the GFI controller 118 determines whether there is a conducting path between the main input 102 and the main output 152 by checking the voltage on AC detect conductor 162, which permits the GFI controller 118 to determine when the relay 116 is open. Once the relay 116 is opened after a sensed ground fault condition, the logic high voltage is stopped. As noted above, the delay circuit 141 causes a delay between the time when fault conductor 128 is no longer receiving a logic high voltage and when relay 116 is turned back on. In accordance with example embodiments, when fault output conductor 128 no longer receives a logic high voltage, transistor Q14 turns off and trip conductor 136 is no longer connected to ground through transistor Q14. In accordance with example embodiments, resistor R56 and capacitor C82 slow down the speed at which the voltage in trip conductor 136 rises to the logic high voltage when transistor Q14 is turned off. In accordance with example embodiments, the resistor R56 and capacitor C82 are selected such that it takes approximately 3 to 4 seconds for the voltage in trip conductor 136 to rise sufficiently high to turn on transistor Q15. In accordance with example embodiments, resistor R56 is approximately 300 kΩ and capacitor C82 is approximately 47 μF.

In accordance with example embodiments, when transistor Q15 is turned on, solenoid conductor 140 is connected to ground, turning on the relay 116, closing the switches 115 on live conductors 108/108A and neutral conductors 110/110A, and restoring the conducting path between the main output 152 and the main input 102.

As shown in FIG. 1, in accordance with example embodiments, the GFI controller 118 is connected through resistors R53 and R54 to AC detect conductor 162 which is connected to the live conductor 108 through diode D10 and to the neutral conductor 110 through diode D9 between the relay 116 and main output 152. In accordance with example embodiments, diodes D9 and D10 prevent inadvertent current flow between the live conductor 108 and neutral conductor 110.

As shown in FIG. 11, in accordance with example embodiments, the AC detect conductor 162 operates optocoupler U12. When optocoupler U12 receives current from AC detect conductor 162, it connects the 12V DC conductor 112 to the GFI controller 118 through resistors R79, R54 and R66. AC detect conductor 162 is connected between the relay 116 and main output 152 to the live conductor 108 through resistors R80 and R53 and diode D10 and to the neutral conductor 110 through resistors R80 and R53 and diode D9.

In accordance with example embodiments, the GFI controller 118 determines whether there is a conducting path between the main input 102 and the main output 152 by checking the voltage on AC detect conductor 162, which permits the GFI controller 118 to determine when the relay 116 is turned back on by detecting the return of voltage to AC detect conductor 162. In accordance with example embodiments, the GFI controller 118 automatically tests to make sure that there is no ground fault a set period after the relay 116 is turned back on. In accordance with example embodiments, the set period is approximately 60 ms after the relay is turned back on. If the automatic test determines there is still a ground fault, a logic high voltage is again provided to fault output conductor 128 and the ground fault procedure is repeated.

In accordance with example embodiments, the GFI controller 118 outputs a logic high voltage on the auto-test conductor 150 at predetermined intervals to initiate an automatic test procedure. In some configurations, the predetermined interval is approximately 17 minutes, however in other embodiments it could be other durations, including for example every 10 minutes or every 60 minutes or every 2 hours or otherwise.

As shown in FIG. 1, in accordance with example embodiments, when a logic high voltage is provided to auto-test conductor 150, transistor Q13 is turned on, connecting test conductor 154 to ground. Examples of appropriate transistors include the BSP125. Test conductor 154 connects to the live conductor 108A through resistor R26 and diode D10 and connects to the neutral conductor 110A through resistor R26 and diode D9 between the transformer 120 and main output 152.

As shown in FIG. 11, in accordance with example embodiments, optocoupler U13 is used instead of transistor Q13. The use of optocouplers U12 and U13 provides GFI controller 118 with further protection from surges by isolating GFI controller 118 from live conductor 108 and neutral conductor 110. Examples of appropriate optocouplers include the TLP188 and TLP291 optocouplers by Toshiba™.

In accordance with example embodiments, by connecting test conductor 154 to ground, a ground fault condition is created in the circuit.

Accordingly, the GFI controller 118 will detect a ground fault condition after a logic high voltage is provided to the auto-test conductor 150, resulting in a logic high voltage being provided to fault output conductor 128 and the ground fault procedure taking place.

In accordance with example embodiments, the GFI controller 118 may have an output which flashes fault LED D11 following particular failures detected by the GFI controller 118. In accordance with example embodiments, the GFI controller 118 will flash fault LED D11 if a ground fault condition is not detected after a logic high voltage is provided to the auto-test conductor 150. In accordance with example embodiments, the GFI controller 118 will flash fault LED D11 if the ground fault procedure has not taken place after a logic high voltage is provided to the auto-test conductor 150. In accordance with example embodiments, the GFI controller 118 will flash fault LED D11 if the ground fault procedure has not taken place after a ground fault condition is detected.

In accordance with example embodiments, the GFI circuit 100 may include a backup reset circuit 170. In the illustrated embodiment, the backup reset circuit 170 includes a counter 172 which counts the number of times the fault LED D11 flashes. Examples of counters include the CD4020B series by Texas Instruments™. In accordance with example embodiments, after a predetermined number of flashes, the counter 172 provides a voltage to backup reset conductor 174 which turns on transistor Q16 (the predetermined number may be configurable, and may be set for example at sixteen fault LED D11 flashes). In accordance with example embodiments, when transistor Q16 is turned on, the GFI controller 118 supply conductor 132 is connected to ground, thereby shutting off power to the GFI controller 118. In accordance with example embodiments, capacitor C83 and resistor R59 hold power in counter supply conductor 182 sufficiently long so that the counter 172 loses power after the GFI controller 118 has been reset as a result of losing power. In accordance with example embodiments, when the counter 172 loses power, transistor Q16 is turned off and power is again supplied to GFI controller 118.

As shown in FIG. 11, in accordance with some alternative embodiments, the GFI controller 118 sends an on-off pulse to transistor Q17 following particular failures detected by GFI controller 118. Transistor Q18 is turned on when transistor Q15 is turned off, meaning the ground fault procedure has taken place and relay 116 has been turned off. When transistor Q17 receives and on-off pulse and transistor Q18 is turned on, resistor R18 will be connected to ground on each on pulse and LED D11 will blink. This means LED D11 will blink if the relay 116 has been turned off and GFI controller 118 has detected a particular failure. If transistor Q17 or Q18 is turned off, then LED D11 will be on since LED D11 is connected to the 5V DC conductor 188 through resistor R18. In these alternative embodiments, instead of counting the number of times the fault LED D11 flashes, the counter 172 of the backup reset circuit 170 counts the number of on-off pulses transistor Q17 receives from GFI controller 118.

In accordance with example embodiments, the counter 172 is reset when a logic high voltage is provided to auto-test conductor 150.

In accordance with example embodiments, AC circuit 60 includes a jumper output 190 connected to the live conductor 108 after the breaker 104 and to the neutral conductor 110. In accordance with example embodiments, the jumper output 190 can be used to connect devices to the power supply unit 50 which are not affected by the state of the relay 116. In accordance with example embodiments, the jumper output 190 can be used to chain together more than power supply unit 50.

As shown in FIG. 11, in accordance with example embodiments, the power supply unit 50 includes a fan and fan control circuit 1408. The fan connects to the fan control circuit 1408 at fan output 1410. Transistors Q19 and Q20 open at two different preset temperatures. At a first temperature, transistor Q20 opens, connecting fan output 1410 to ground through resistor R75. Resistor R75 limits the current so that the fan only operates at half speed. At a second temperature, transistor Q19 opens, connecting fan output 1410 directly to ground. When transistor Q19 opens, the fan operates at full speed since the current is only limited by the fan's internal resistance.

As shown in FIG. 1, in accordance with example embodiments, the 12V DC conductor 112 is also connected to a low-dropout linear regulator 186. The low-dropout linear regulator provides a 5V output to the 5V DC conductor 188 from the 12V provided by the 12V DC conductor 112. In accordance with example embodiments, indicator LED D13 is turned on when the 5V DC conductor 188 is receiving power. Examples of 12V to 5V low-dropout linear regulators include the LM1117 low-dropout linear regulator by Texas Instruments™.

As shown in FIG. 11, in accordance with example embodiments, the 24V DC conductor 1402 is connected to low-dropout linear regulators 1404 and 1406. Low-dropout linear regulator 1404 provides a 5V output to the 5V DC conductor 188 from the 24V provided by the 24V DC conductor 1402. Low-dropout linear regulator 1406 provides a 12V output to the 12V DC conductor 112 from the 24V provided by the 24V DC conductor 1402. Examples of 24V to 12V low-dropout linear regulators include the US78M series low-dropout linear regulators by Texas Instruments™. Examples of 24V to 5V low-dropout linear regulators include the AP2204 series voltage regulators by Diodes Incorporated.

In accordance with example embodiments, capacitors are used within the power supply unit 50 to reduce potential noise. For example, capacitors C88, C89, C90 and C91 shown in FIG. 11 can be connected to mountings on a PCB to reduce general noise in the power supply unit 50.

Figure 2:
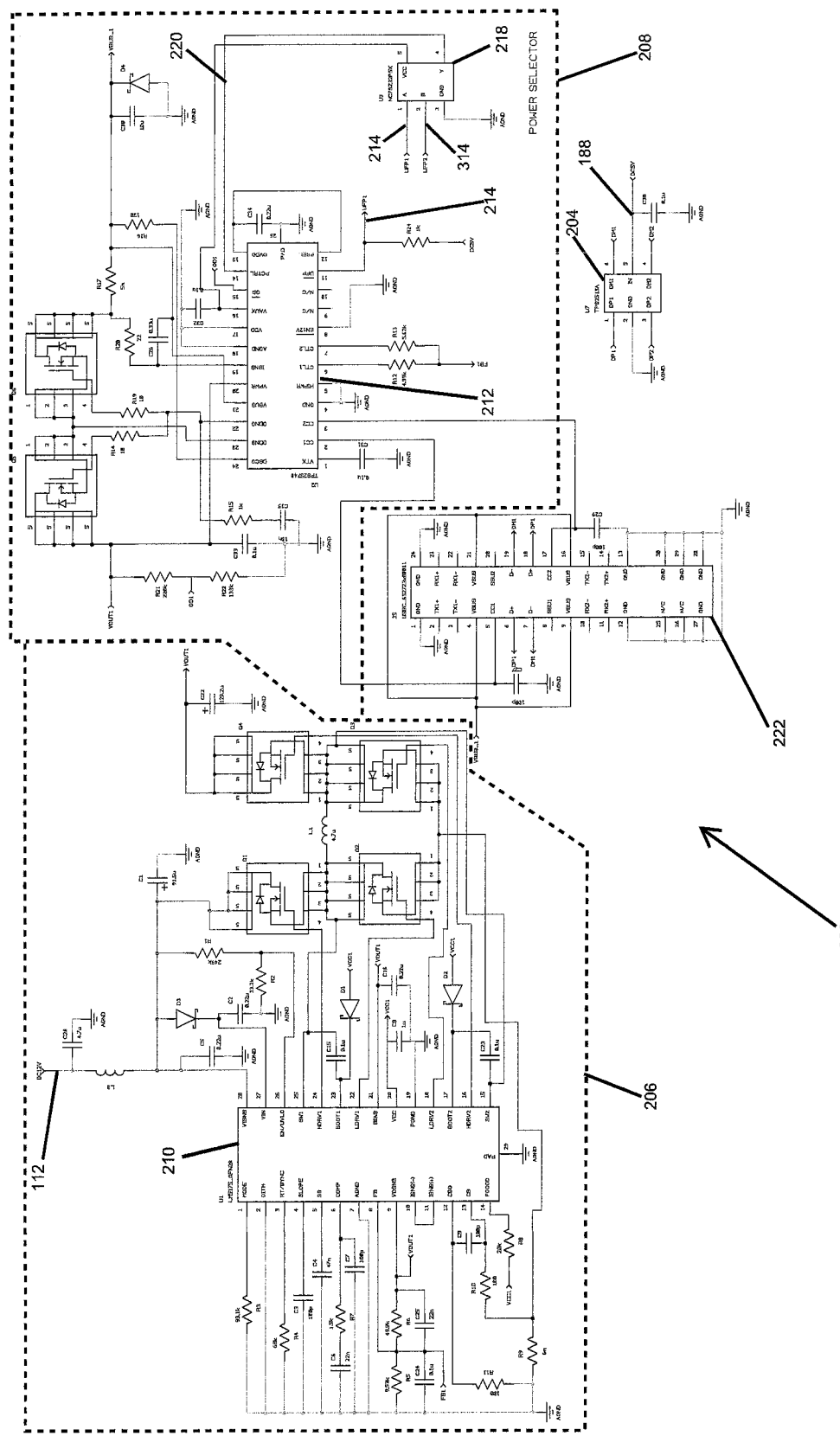
FIG. 2 is an electric schematic for a first USB-C power controller of the power supply unit in accordance with an example embodiment.
Figure 12:
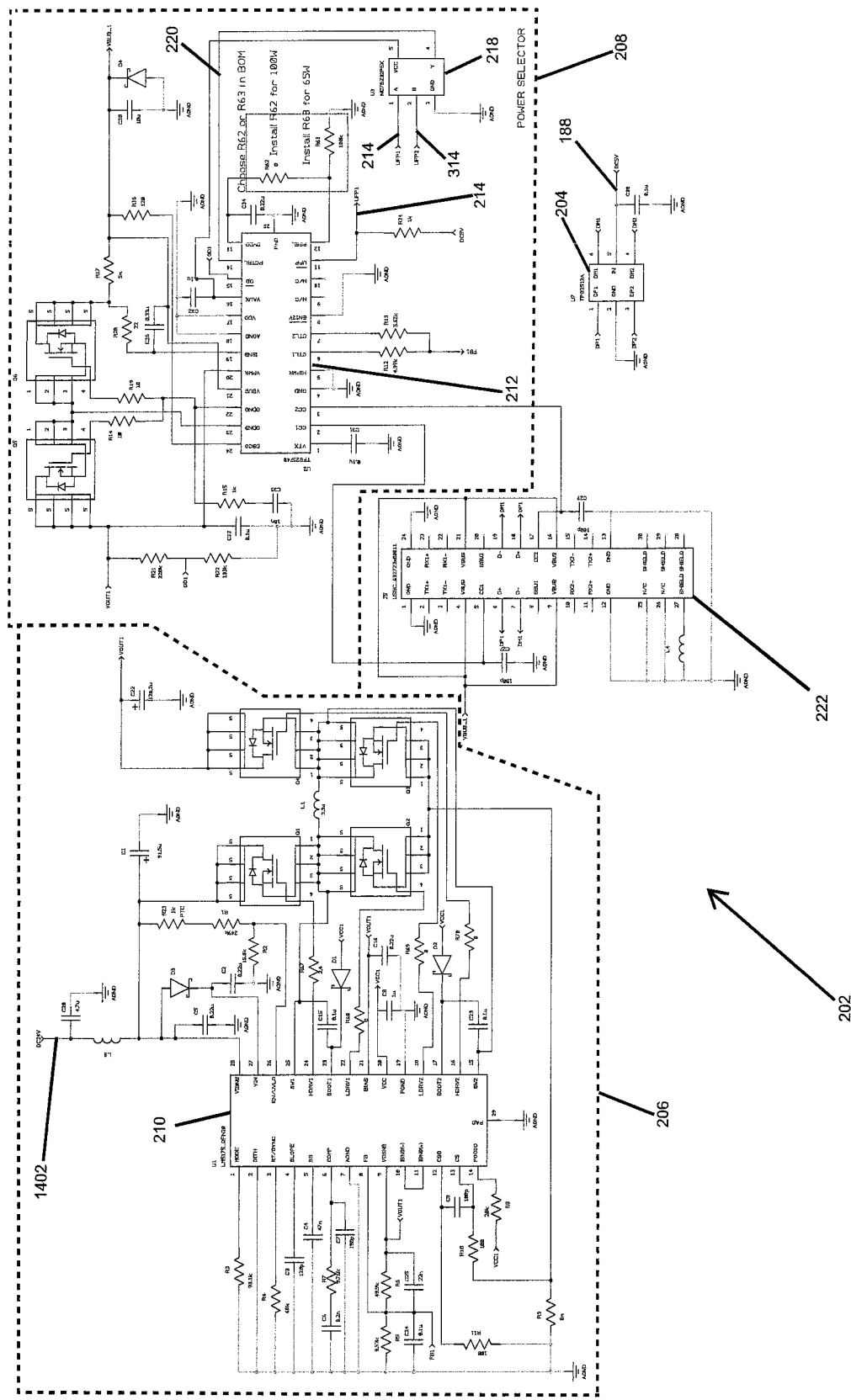
FIG. 12 is an electric schematic for a first USB-C power controller of the power supply unit in accordance with an example embodiment.

In example embodiments, the power supply unit 50 also includes DC power output ports 222, 322 (FIG. 4), and example circuits (first USB-C circuit 202 and second USB-C circuit 302) for providing power to such outputs will now be described with reference to FIGS. 2, 3, 12 and 13. As shown in FIGS. 2 and 12, the 5V DC conductor 188 from AC to DC power supply circuit 70 is used to power a legacy USB controller 204. An example of a legacy USB controller 204 is the TPS2153A by Texas Instruments™.

As shown in FIG. 2, in accordance with example embodiments, the 12V DC conductor 112 from AC to DC power supply circuit 70 is used to provide power to a DC to DC converter 206 of the first USB-C circuit 202. As shown in FIG. 12, the 24V DC conductor 1402 from AC to DC power supply circuit 70 is used to provide power to a DC to DC converter 206 of the first USB-C circuit 202. In accordance with example embodiments, the DC to DC converter 206 is used to regulate output voltage for the first USB-C circuit 202. DC to DC converter 206 includes a DC to DC converter chip 210 and related components for the DC converter chip. In accordance with example embodiments, the DC to DC converter chip 210 may be 42V Wide Vin 4-Switch Synchronous Buck-Boost Controller LM5175 by Texas Instruments™. In accordance with example embodiments, the components used in conjunction with the DC to DC converter chip 210 to achieve the desired voltages for the first USB-C circuit 202 are selected in accordance with the DC to DC convert chip's 210 manufacturer's specification. In accordance with example embodiments, the desired voltages are 5V, 12V and 20V. In accordance with example embodiments, the desired voltages include all of or a subset of 5V, 9V, 12V, 15V and 20V.

In accordance with example embodiments, the first USB-C circuit 202 includes a USB-C controller 208. In accordance with example embodiments, the USB-C controller 208 includes a USB-C controller chip 212 and related components. In accordance with example embodiments, the USB-C controller chip 212 may be a USB Type-C and USB PD Source Controller TPS25740 by Texas Instruments™. In accordance with example embodiments, the components needed to properly operate the USB-C controller 208 for the desired voltages are selected in accordance with the USB-C controller chip's 212 manufacturer's specification.

Figure 3:
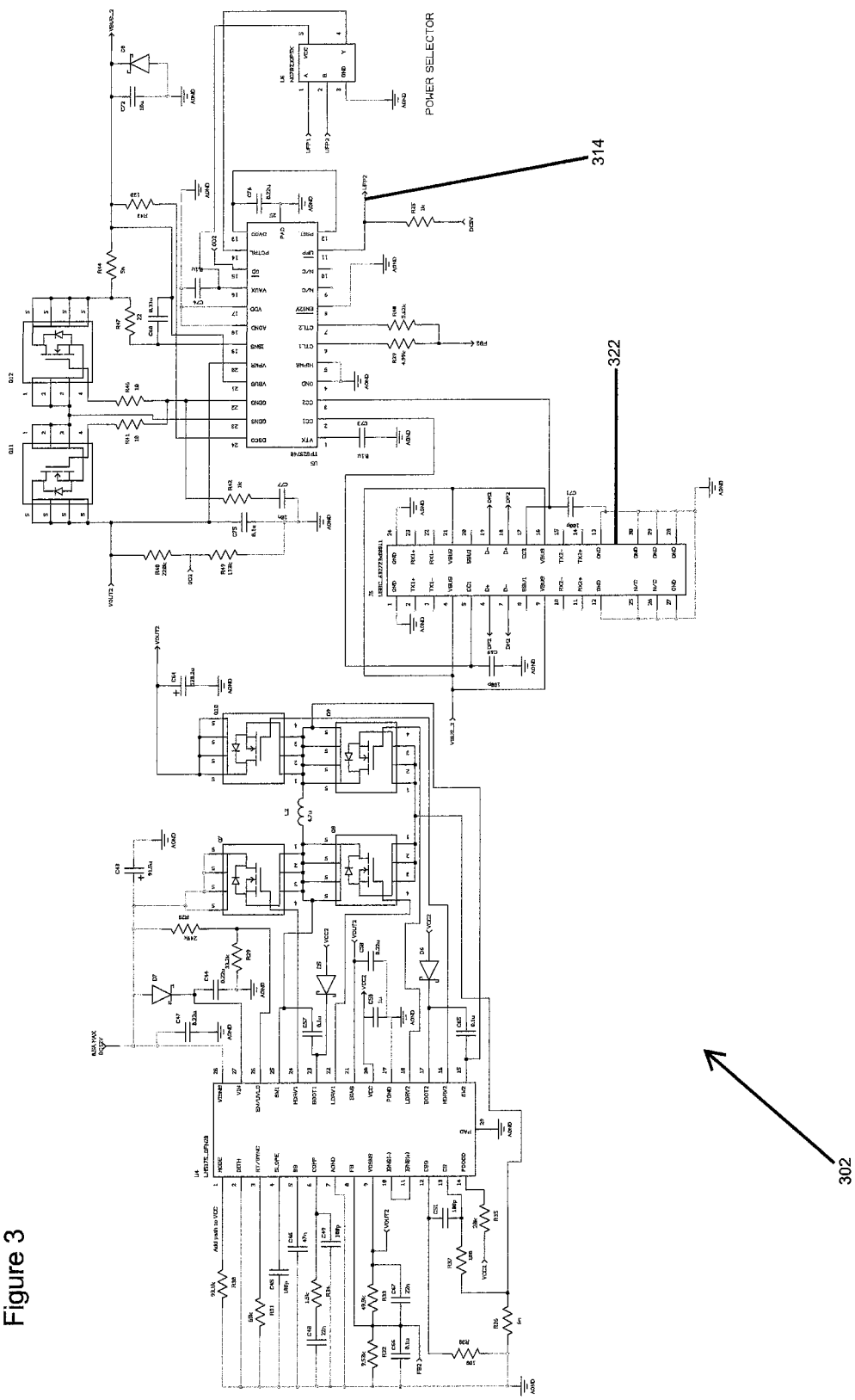
FIG. 3 is an electric schematic for a second USB-C power controller of the power supply unit in accordance with an example embodiment.
Figure 13:
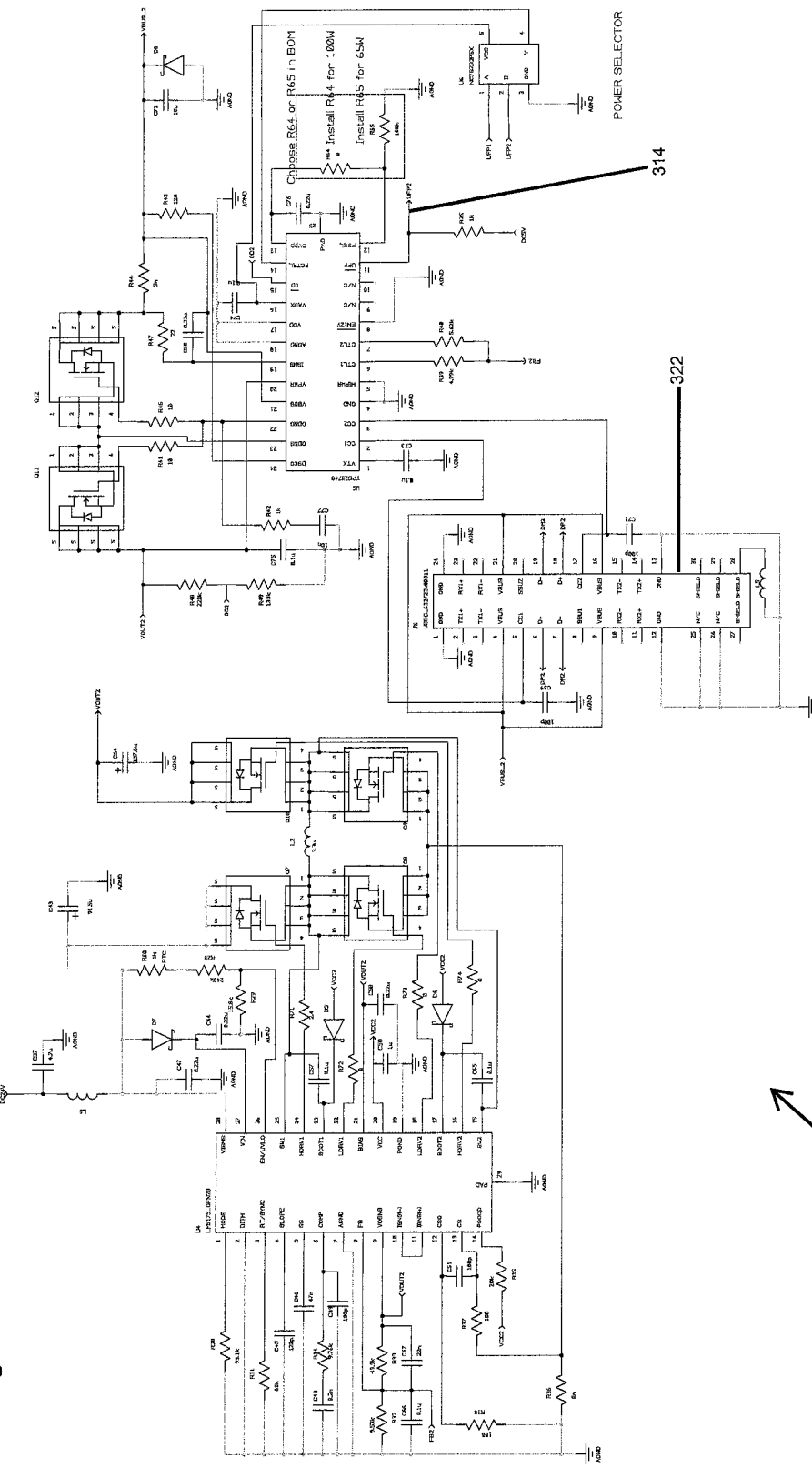
FIG. 13 is an electric schematic for a second USB-C power controller of the power supply unit in accordance with an example embodiment.
Figure 14:
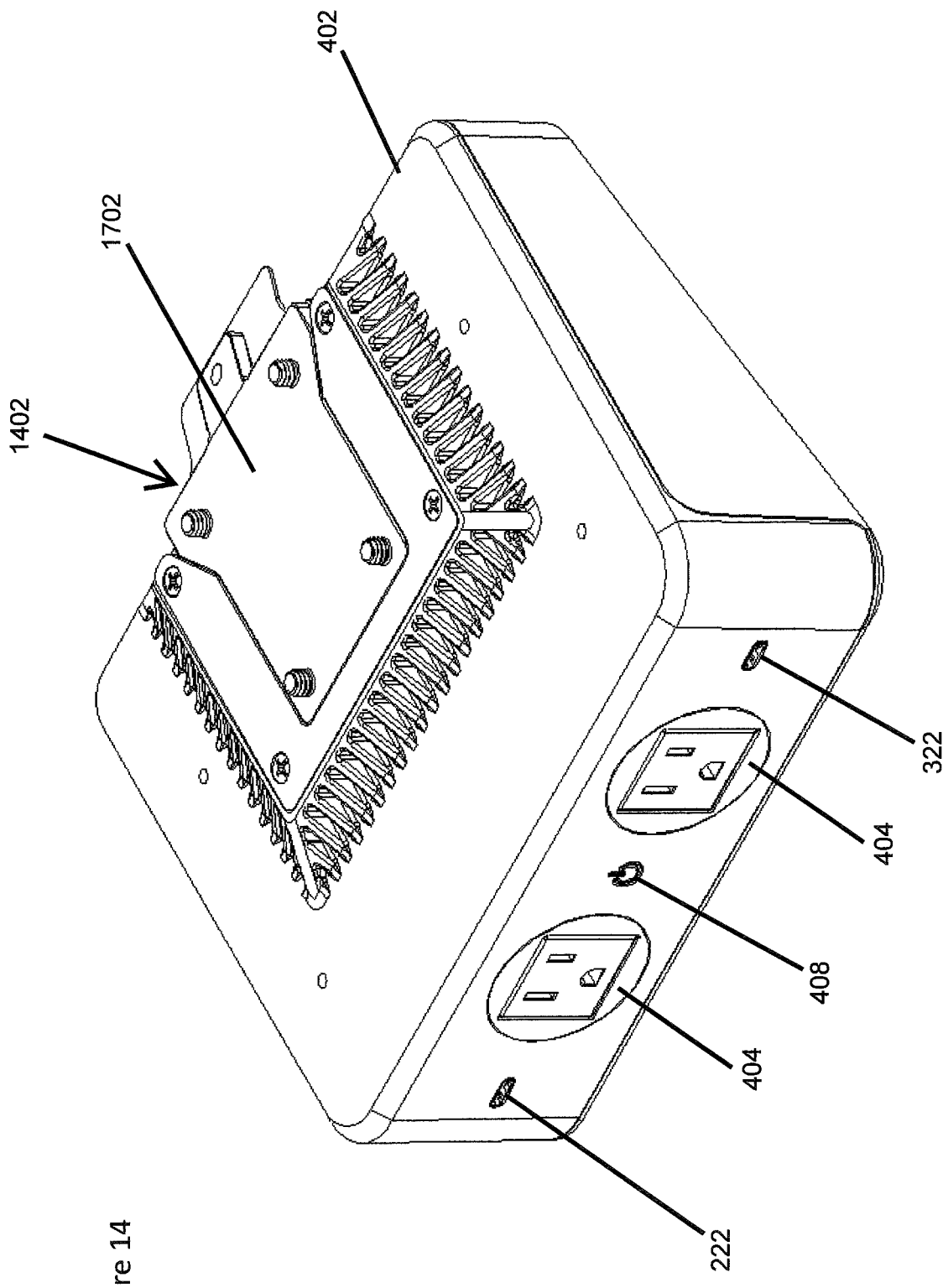
FIG. 14 is a profile drawing of a case of the power supply unit, which contains the automatic ground fault interrupter, in accordance with an example embodiment.

Second USB-C circuit 302, which is substantially similar to circuit 202, is shown in FIGS. 3 and 13. In example embodiments, the second USB-C circuit 302 shares the legacy USB controller 204 with the first USB-C circuit 202

In accordance with example embodiments, the amount of power output by the first USB-C circuit 202 and the second USB-C circuit 302 is adjusted when devices are connected to both the first USB-C circuit 202 and the second USB-C circuit 302.

As shown in FIGS. 2 and 12, in accordance with example embodiments, the USB-C controller chip 212 includes first port attachment indicator output 214 that outputs a high logic voltage if no device is connected to the USB-C port 222 and a low logic voltage is a device is connected to the USB-C port 222. In the illustrated embodiment, the first port attachment indicator output 214 from the first USB-C circuit 202 and the second port attachment indicator output 314 from the second USB-C circuit 302 are connected by an OR logic chip 218. Examples of OR logic chips include the NC7SZ32P5X. The output from the OR logic chip 218 is connected to a power control input line 220 of the USB-C controller chip 212.

When the power control input line 220 is fed a low logic voltage, the USB-C controller chip 212 limits the power to the USB-C port, and when the power control input line 220 is fed a high logic voltage, the USB-C controller chip 212 provides a higher power output to the USB-C port. In accordance with example embodiments, the non-limited power output is approximately 92.8 W while the limited power output is approximately 46.4 W.

In accordance with the example embodiments, the output of the OR logic chip 218 limits the power supplied by the USB-C controller chip 212 to the USB port 222 when devices are connected to the both the first USB-C circuit 202 port 222 and the second USB-C circuit 302 port 322. Limiting the power supplied by the first USB circuit 202 and the second USB-C circuit 302 when two devices are connected can help keep power within the power limits of the 12V or 24V AC to DC power supply 106.

In accordance with example embodiments, components of the circuits depicted as a single component may be implemented as a number of components connected in series or parallel. For example, a capacitor in a circuit may be implemented as a number of capacitors connected in series or parallel or a resistor may be implemented as a number of resistors in series or parallel to achieve desired parameters.

Figure 4:
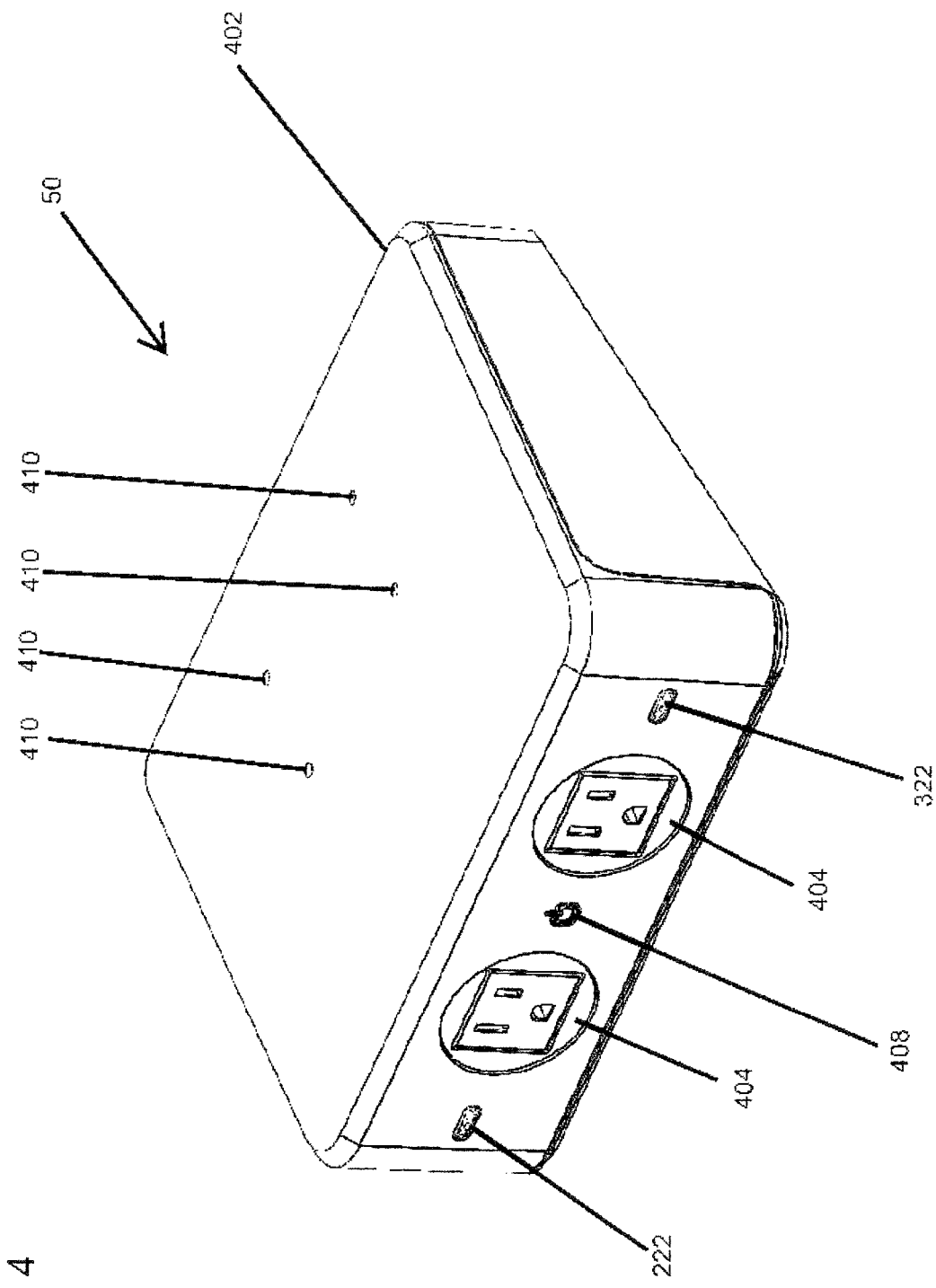
FIG. 4 is a profile drawing of a case of the power supply unit, which contains the automatic ground fault interrupter, in accordance with an example embodiment.
Figure 7:
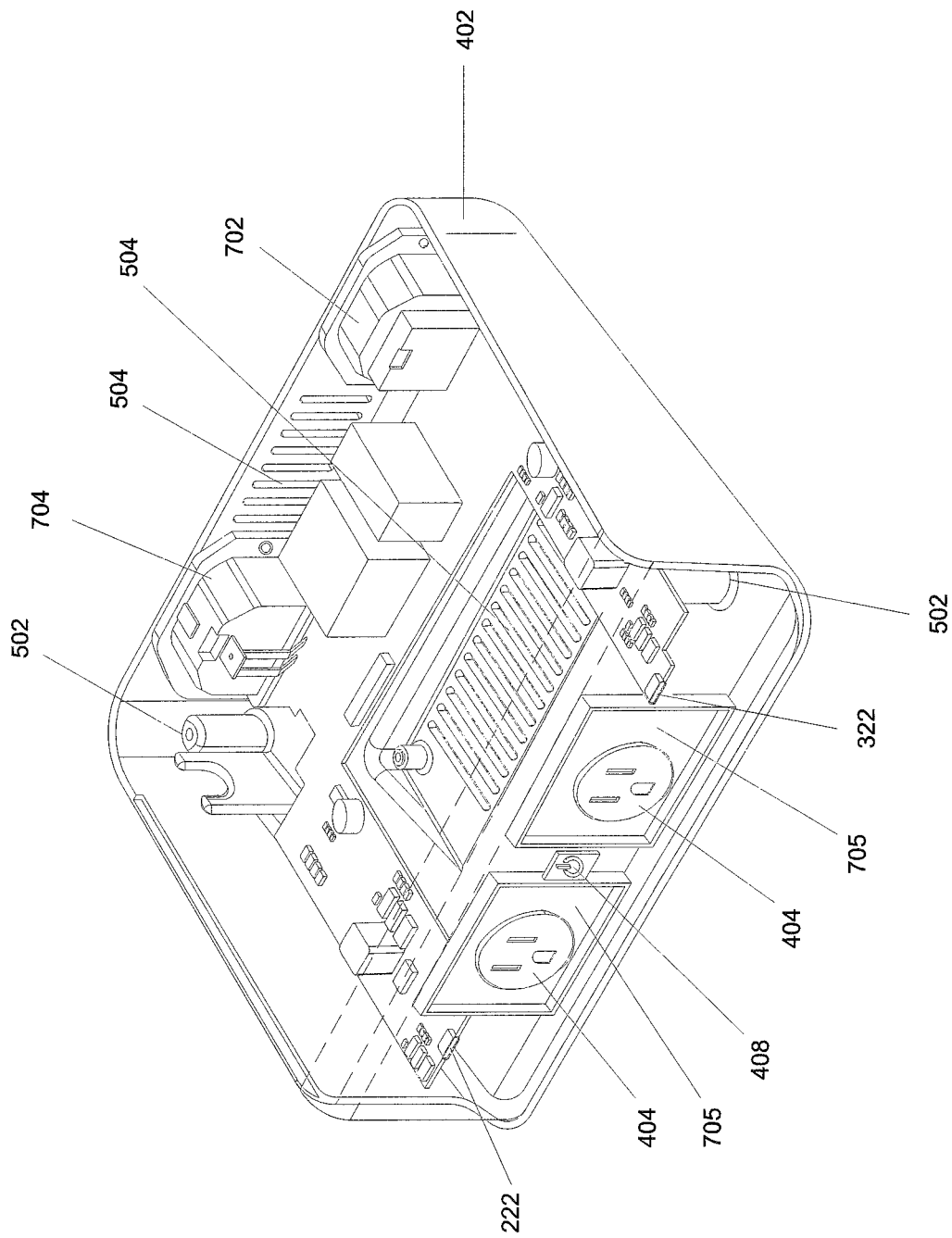
FIG. 7 is a partial see-through profile drawing of the case of FIG. 4.
Figure 8:
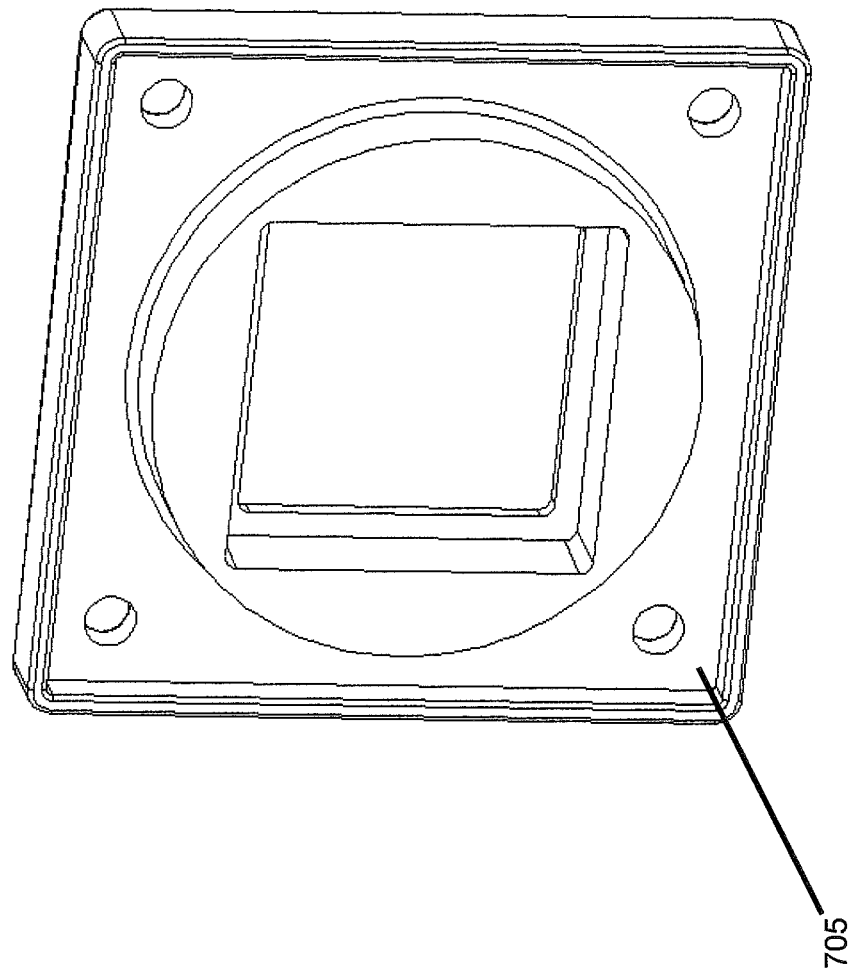
FIG. 8 is a perspective view of a modular insert for the case of FIG. 4.

As shown in FIGS. 4, 7, 14 and 18 in accordance with example embodiments, the circuits 60, 70, 100, 202 and 302 that make up the power supply unit 50 are contained within a rigid casing 402. In accordance with example embodiments, main output female AC receptacles 404 are connected to main output 152 and can be used to connect devices to the power supply unit 50. As shown in FIG. 7, in accordance with example embodiments, main input male AC receptacle 702 is connected to the main input 102 and jumper female AC receptacle 704 is connected to jumper output 190. In accordance with example embodiments, the AC receptacles 404, 406, 702, and 704 are modular and changeable to different regional AC receptacles. As shown in FIG. 4, in accordance with example embodiments, the AC receptacles 404, 406, 702, and 704 can use standard North American AC receptacles. In accordance with example embodiments, European AC receptacles are used instead of North American AC receptacles. In accordance with example embodiments, other regional AC receptacles are used. In some examples, such as shown in FIGS. 7 and 8, modular inserts 705 may be provided that can be fitted into corresponding openings in the case 402 to support different plug receptacle configurations.

In accordance with example embodiments, openings are provided in the rigid casing 402 for the USB-C ports 222 and 322. In accordance with example embodiments, a status indicator 408 is provided in the rigid casing 402. In accordance with example embodiments, the status indicator can be indicator LED D13. In accordance with example embodiments, the status indicator can be fault LED D11.

In accordance with example embodiments, the rigid casing 402 is formed from any appropriate rigid material. In accordance with example embodiments, the rigid casing 402 is formed from rigid plastic, metal or a combination of plastic and metal.

Figure 5:
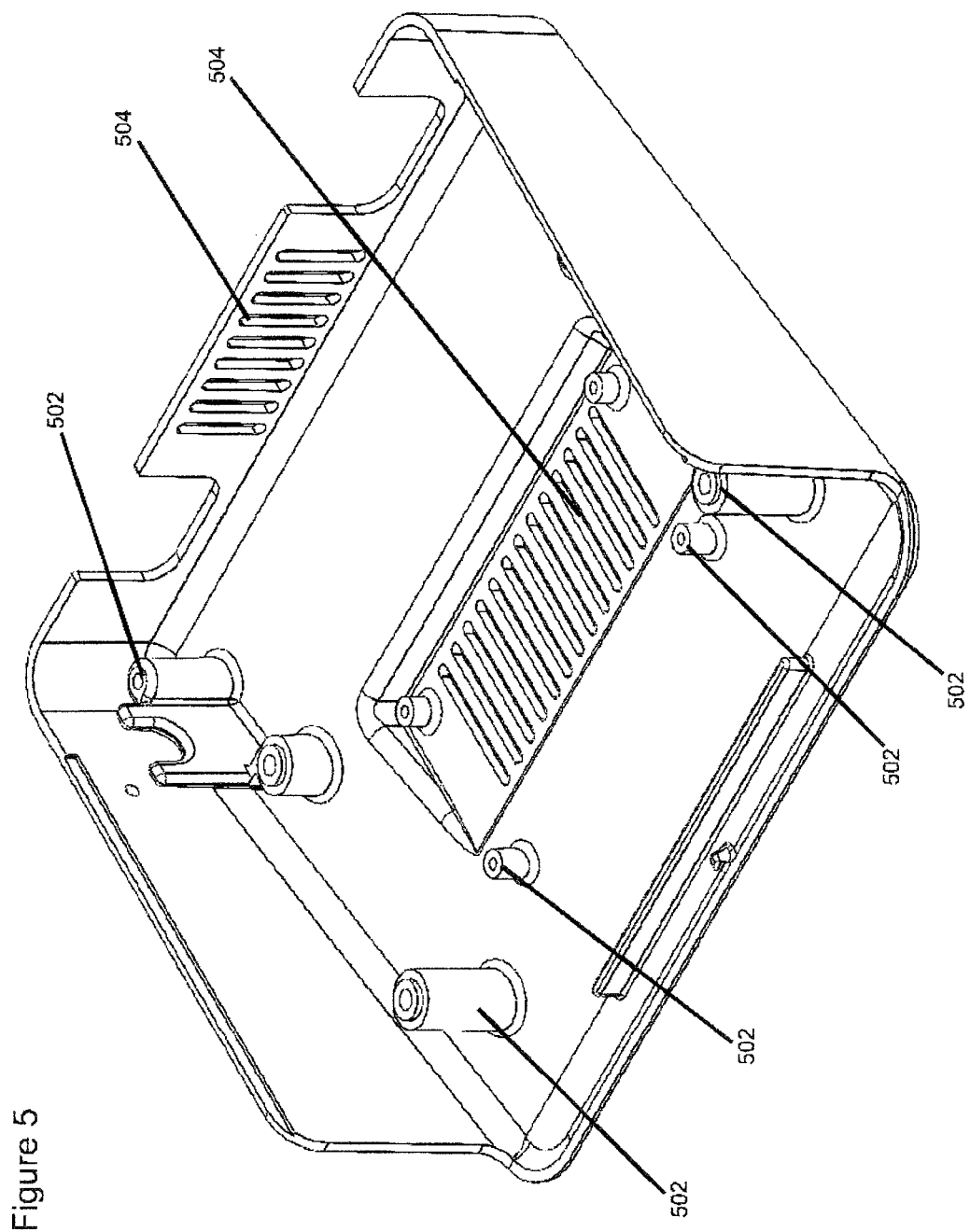
FIG. 5 is a profile drawing of a first portion of the case of FIG. 4.
Figure 15:
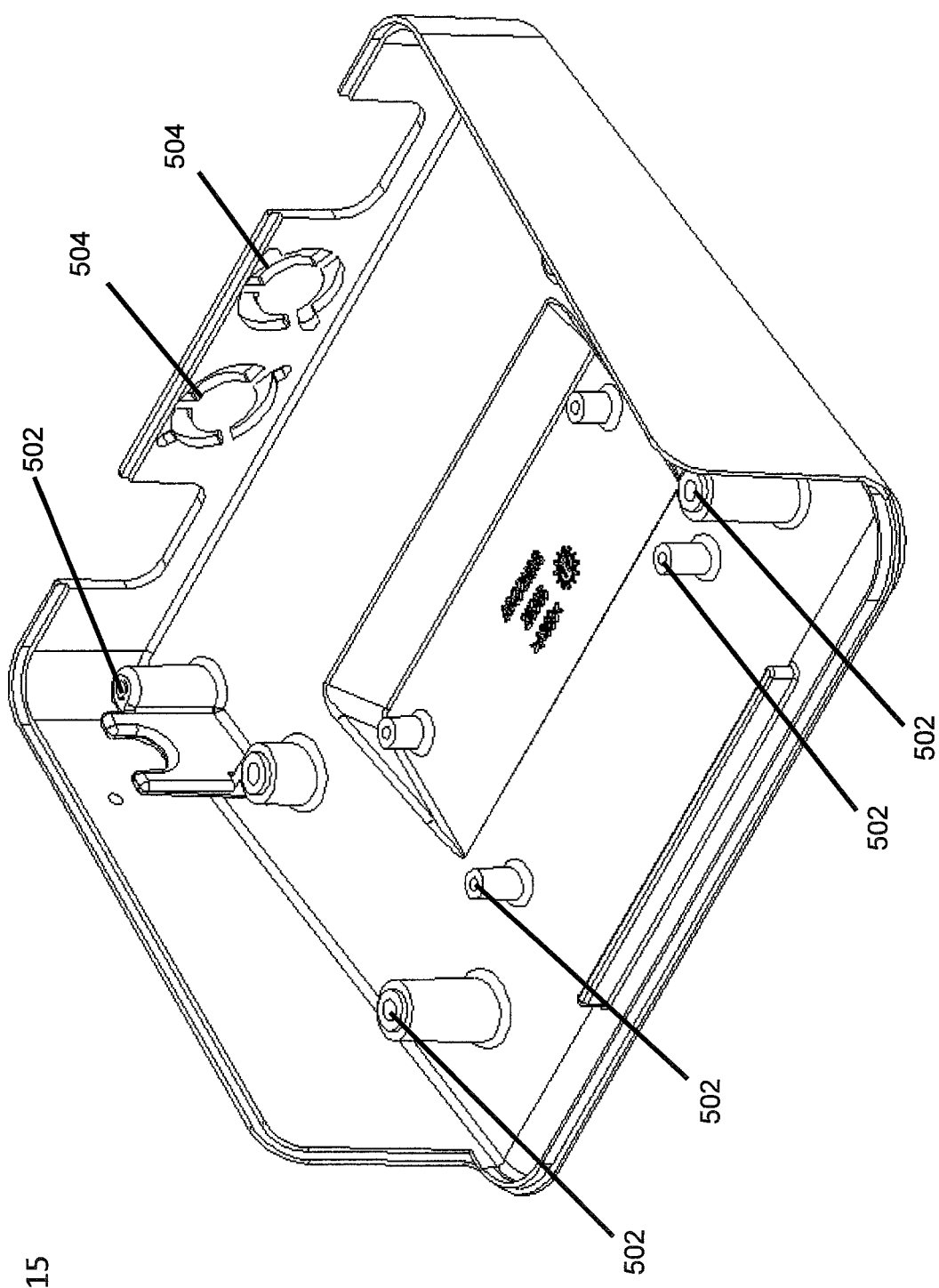
FIG. 15 is a profile drawing of a first portion of the case of FIG. 14.
Figure 16:
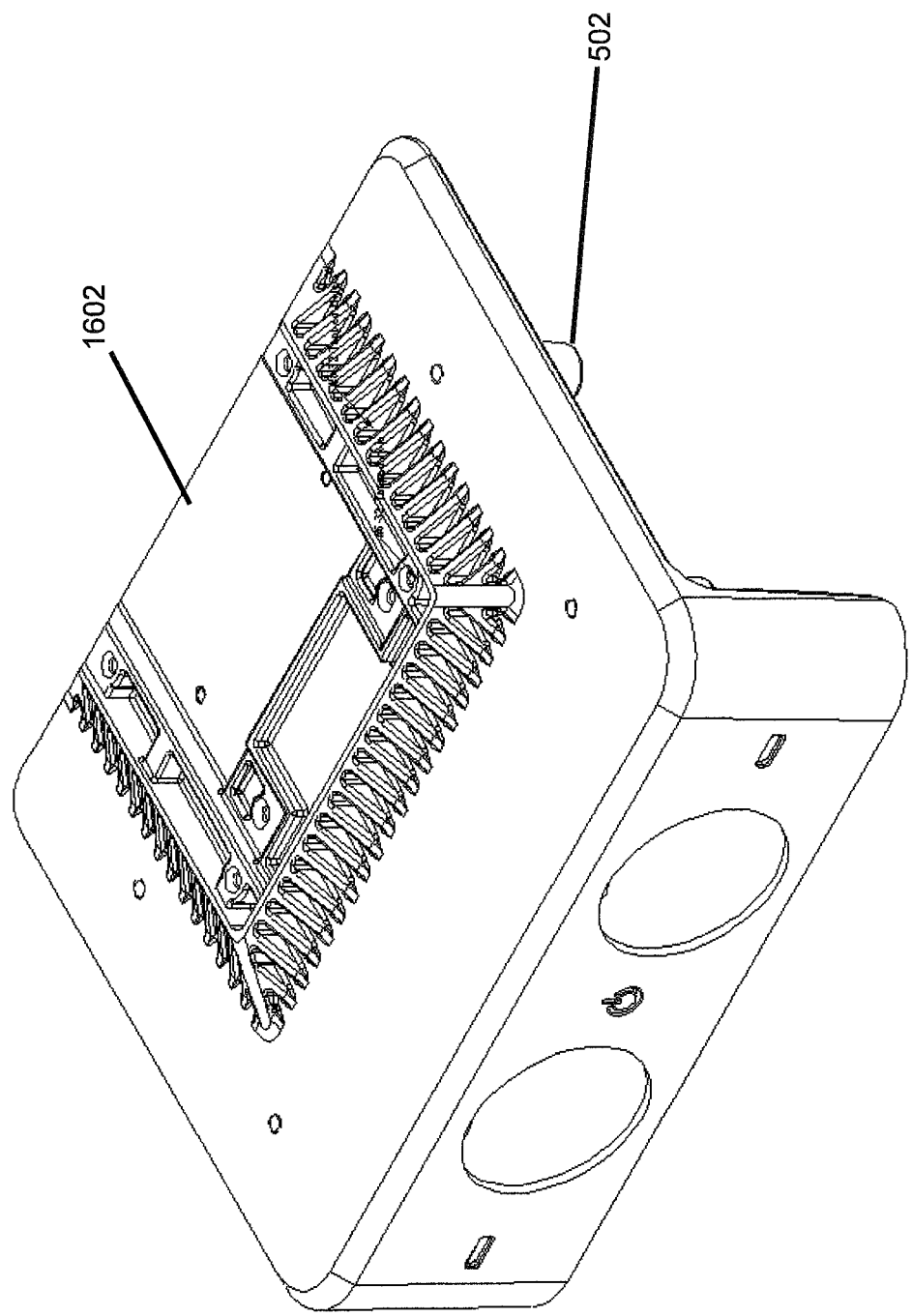
FIG. 16 is a profile drawing of a second portion of the case of FIG. 14.

As shown in FIGS. 5, 6, 15 and 16, in accordance with example embodiments, the rigid casing 402 is formed in two parts. As shown in FIGS. 5 and 15, in accordance with example embodiments, the rigid casing 402 includes mounts 502 which can be used to secure the components of the power supply circuits and to provide further structural support for the rigid casing 402. In accordance with example embodiments, the rigid casing can also include vents 504 to provide air flow within the rigid casing 402 to assist in dissipating heat from the power supply circuits. In accordance with example embodiments, the circuits are arranged so that the component which generate the most heat are located near the vents 504.

Figure 9:
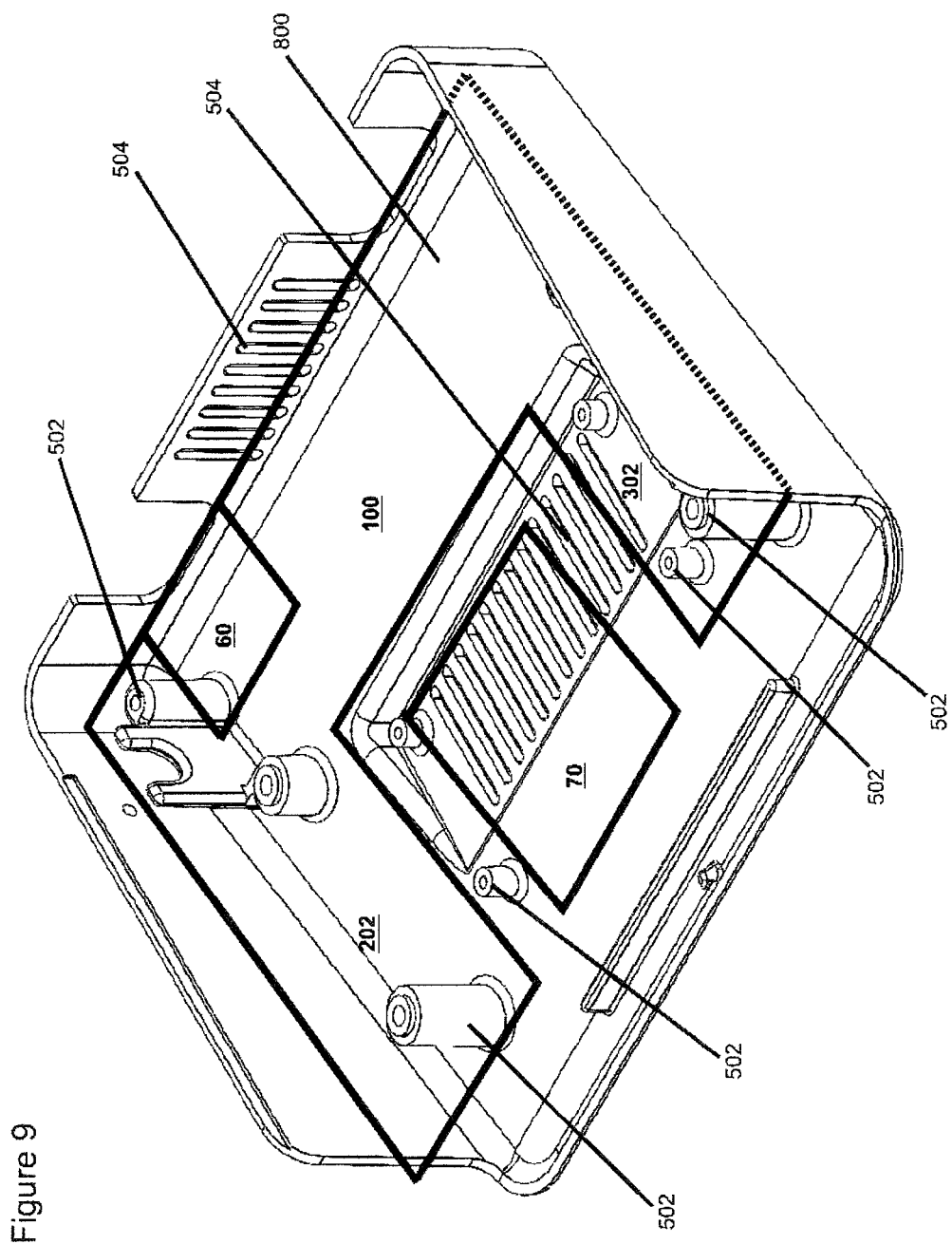
FIG. 9 is a schematic view of circuit board layout in the case of FIG. 4.

FIG. 9 is a schematic view of a possible component layout for power supply unit 50, In one example, a generally "U" shaped printed circuit board (PCB) 800 is populated with the components that make up GFI circuit 100 and USB circuits 202, 302. AC to DC power supply 70 is centrally located, separate from PCB 800, over vents 504. In example embodiments, all of the circuit components and spacing of components and conductive lines on the PCB 800 and within the casing 402 are configured to meet required safety codes in multiple jurisdictions such as North America and Europe such that the power supply unit 50 can be modified for use in different jurisdictions with different current and voltage inputs easily by changing modular plug receptacles 404.

Figure 6:
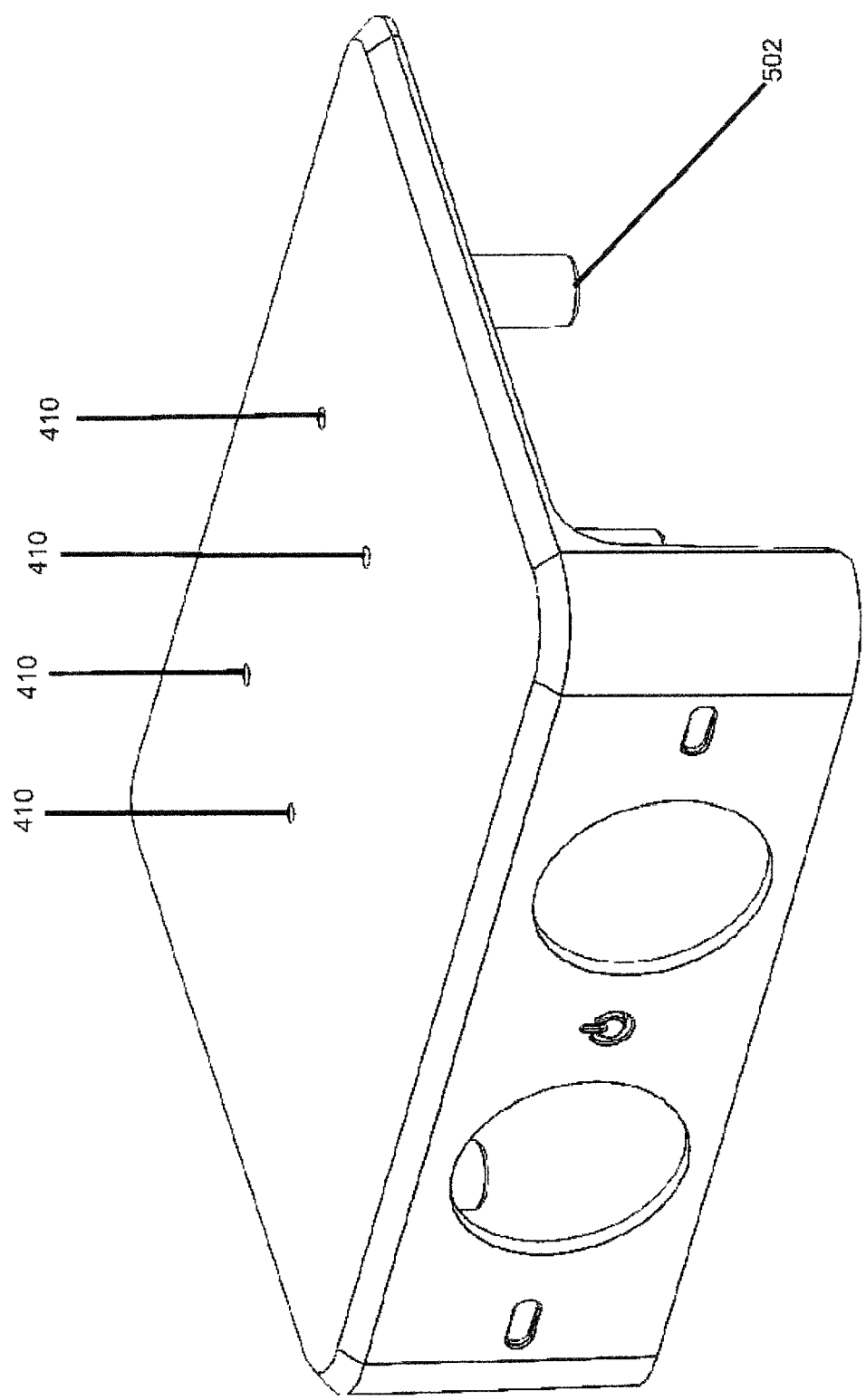
FIG. 6 is a profile drawing of a second portion of the case of FIG. 4.

As shown in FIGS. 4, 6, and 7 the casing 402 includes four mounting interface elements 410 in an upper surface thereof. In example embodiments, the mounting interface elements 410 are threaded holes that are arranged to cooperate with corresponding openings in a mounting bracket that is provided on furniture or other fixtures in a public space. In example embodiments, a plurality of the power supply units are secured by interface elements 410 to furniture, for example airport or waiting room seating, in a public area.

Figure 17:
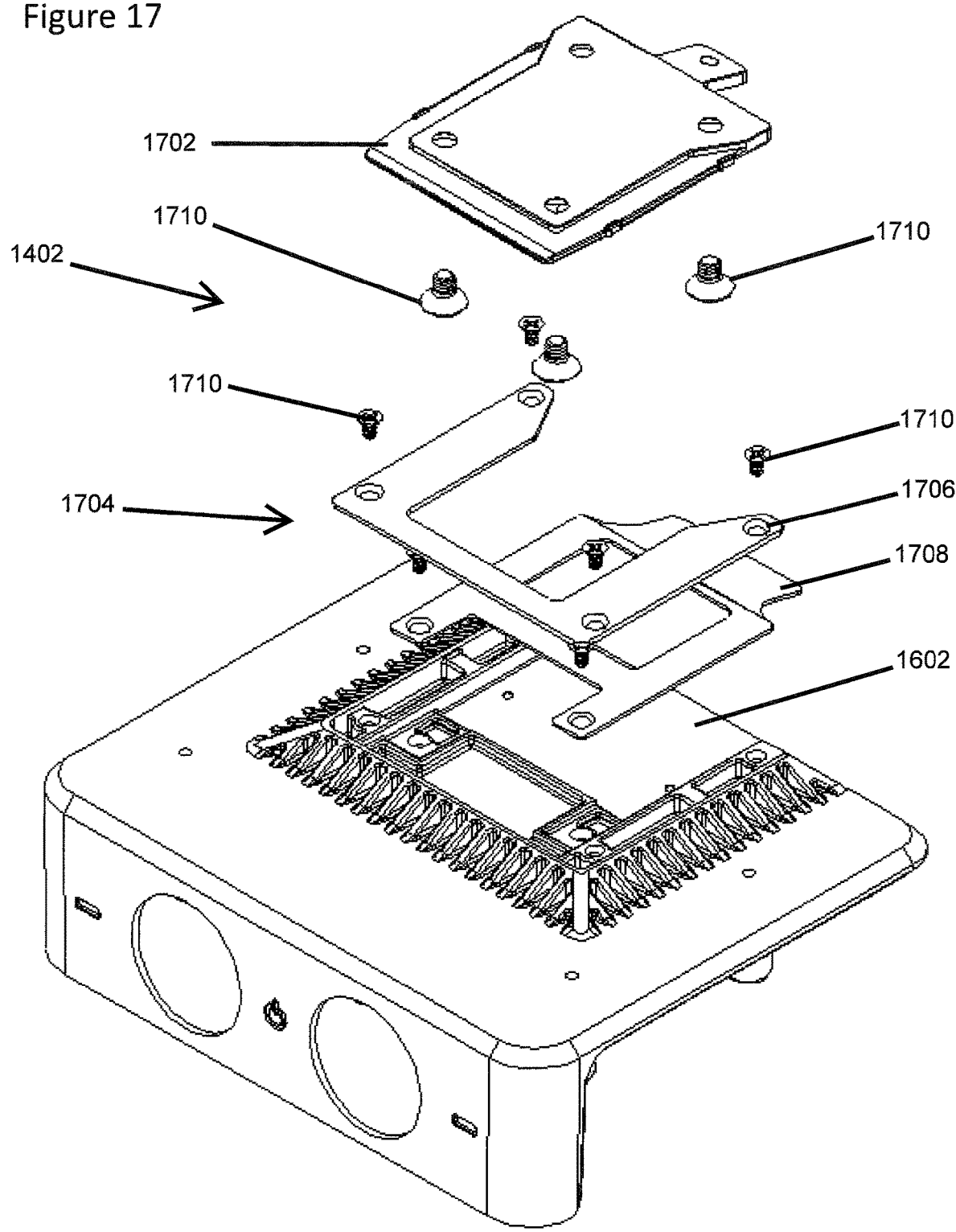
FIG. 17 is a partially exploded profile drawing of the case of FIG. 14.
Figure 18:
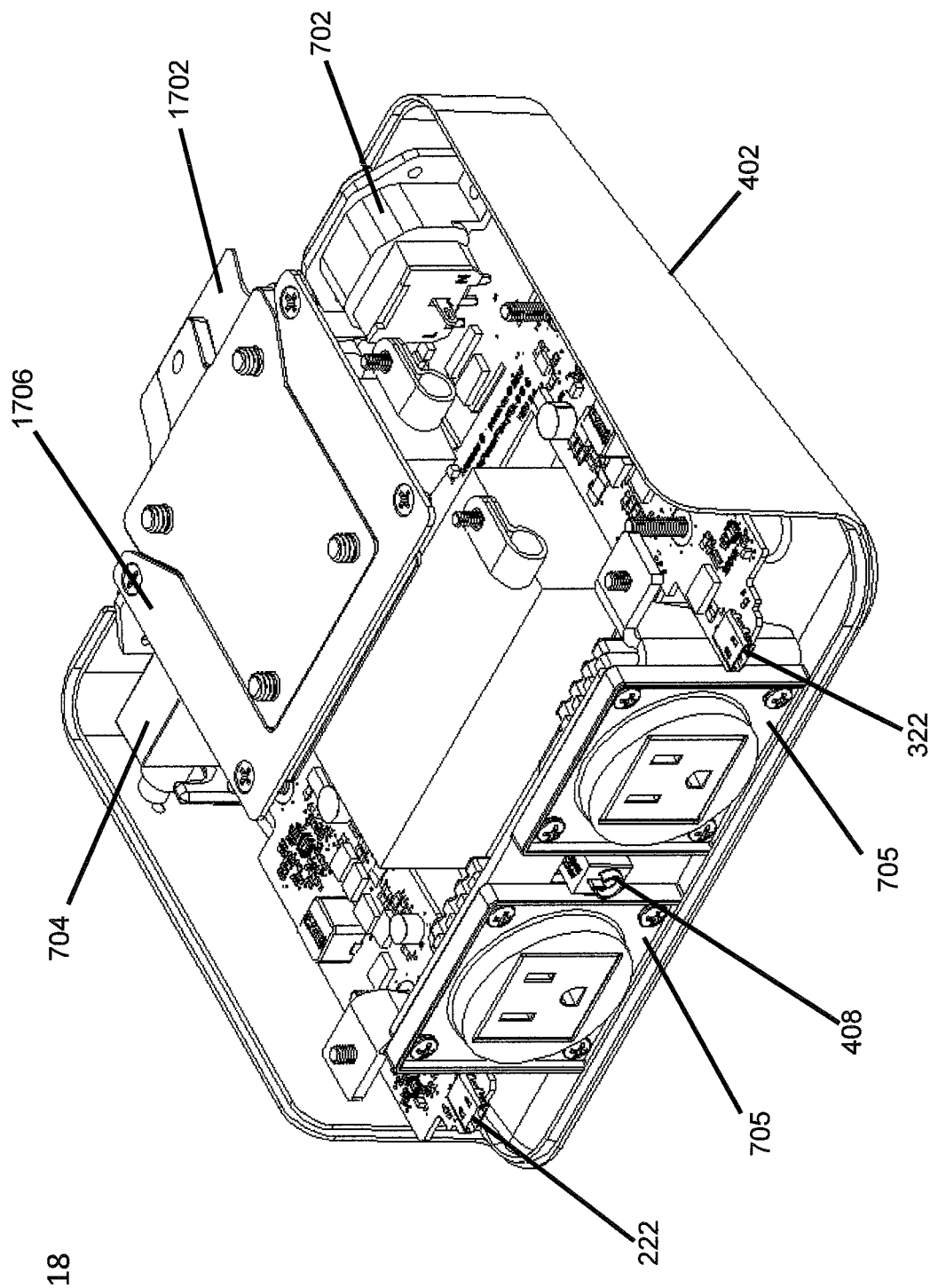
FIG. 18 is a partial see-through profile drawing of the case of FIG. 14.

As shown in FIGS. 14, 16, 17, and 18, in accordance with alternative example embodiments, the casing 402 includes a mounting element 1402 in an upper surface thereof. As shown in FIG. 17, mounting element 1402 consists of a furniture bracket 1702 and a case bracket 1704. The case bracket 1704 is connected to a mounting portion 1602 of the casing 402 using fasteners 1710. The furniture bracket 1702 is connected to furniture or other fixtures using fasteners 1710. The case bracket 1704 and furniture bracket 1702 are arranged so that the furniture bracket 1702 can slide into the case bracket 1704 when mounting the casing 402. As shown in FIGS. 17 and 18, in accordance with example embodiments, the case bracket 1704 can comprise an upper portion 1706 and lower portion 1708. When mounting the casing 402, the furniture bracket 1702 is inserted between the upper portion 1706 and the lower portion 1708 of the case bracket 1704.

In example embodiments, there are no external GFI test or reset buttons accessible on the outside of the casing 402, as the automatic reset feature of the GFI circuit 100 eliminates the need for physical user interaction to reset the power supply unit 50. The absence of an external GFI test/reset interface makes unit 50 particularly amendable for use in public spaces for at least the following reasons: individuals can't use a "test" button found on traditional GFCIs to inadvertently or maliciously trip the GFI circuit 100; the power supply unit 50 does not require a manual reset after a trip occurs as it automatically resets; the presence of an automatic reset makes it convenient to frequently self-test the circuit; a device failure due to overuse of GFI test and reset buttons will not occur. In example embodiments GFI circuit 100, with its absence manual physical buttons, can have a life cycle that greatly exceeds GFCI's with physical buttons. For example, in some configurations, power supply unit 50 may survive 500,000 or more trip and reset cycles.

Figure 10:
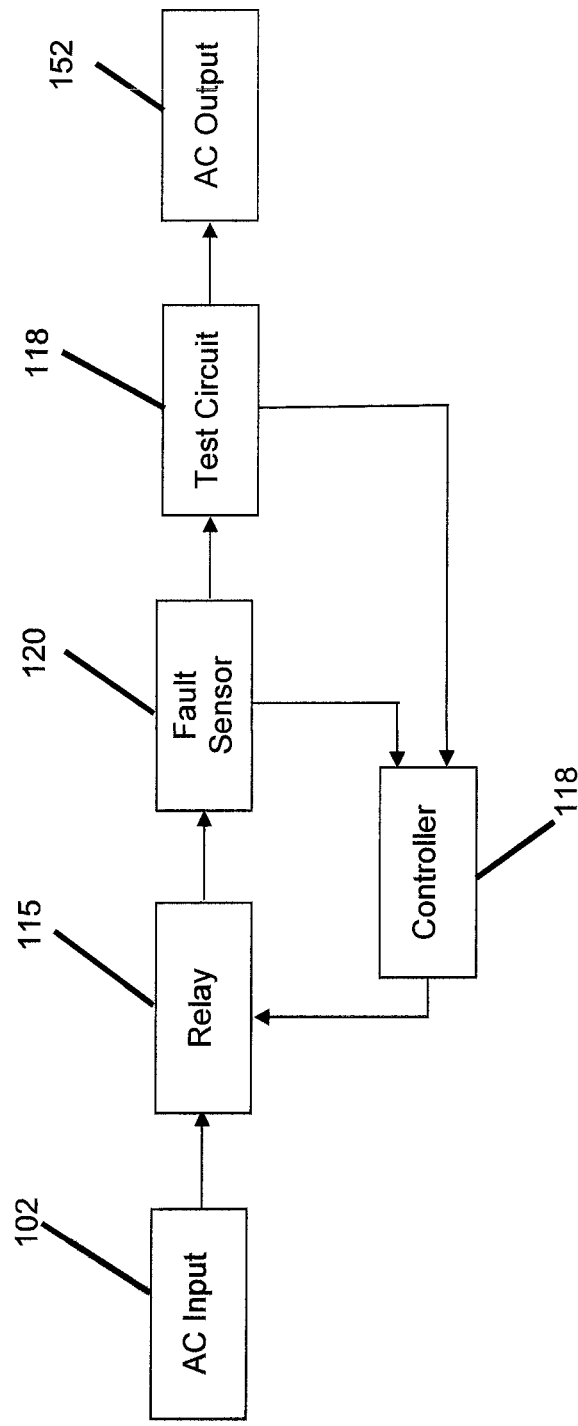
FIG. 10 is a block diagram representation of an example implementation of a GFI circuit of the power supply unit.

Operation of the GFI circuit 100 in power supply unit 50 will be briefly summarized with reference to the system block diagram of FIG. 10, accordingly to a non-limiting example embodiment: (1) Once a differential current is detected (as low as 5.5 Ma RMS) by fault sensor 120, relay 115 is activated to trip for 3-4 sec, thus disabling AC output 152 (and receptacles 404). After first duration or period of 3-4 sec, the relay 115 is automatically deactivated to allow it to close, enabling power back to the AC receptacles 404. After being enabled for a second duration of 60 ms, an auto-test is performed by controller 118 to make sure that there is no ongoing ground fault. Accordingly, in a continued ground fault situation, power will be momentarily provided at AC output 152 for a very brief duration of (e.g. 60 ms), followed by a long duration (e.g. 3-4 seconds—for example at least 5 times longer than the "on" duration) of no power, and such cycling will continue as long as the ground fault condition exists. The "on" duration is selected to be short enough so as to avoid injury.

In an example, regular auto-testing is performed every 17 minutes. During the auto-test, if there is a fault, the relay 115 will be deactivated to stop power to AC output 152.

As will be appreciated from the above description, in addition to GFI circuit 100 the power supply unit 50 has a primary power side safety device in the form of the breaker 104 that is part of main AC power supply circuit 60. Accordingly, in the event that GFI circuit 100 does not operate properly, primary breaker 104 will still stop power to the entire unit 50 in the event that current exceeds a threshold.

Certain adaptations and modifications of the described embodiments can be made. Therefore, the above discussed embodiments are considered to be illustrative and not restrictive.

What is claimed is:

1. A power supply unit comprising
a main power input for connecting to an AC power source;
a power output for providing AC power;
live and neutral conductive paths connecting the power input to the power output, including a relay between the power input and power output;
a current sensor for sensing a differential current between the live and neutral conductive paths; and
control circuitry operatively connected to the relay and the current sensor, the control circuitry being configured to: upon detecting that the differential current between the live and neutral conductive paths exceeds a threshold, cause the relay to stop current flow from the main power input to the power output for a first predetermined duration after which the relay automatically allows current flow from the main power input to the power output to resume, wherein the control circuitry is further configured to: generate a differential current between the live and neutral conductive paths at a predetermined interval by grounding the live conductive path; identify a failure if a differential current is not detected after the differential current is generated; and signal the failure if the failure is identified.

2. The power supply unit of claim 1 wherein the control circuitry is configured to, after the first predetermined duration, perform a self test after a second predetermined duration that is shorter than the first predetermined duration to determine if the differential current between the live and neutral conductive paths exceeds the threshold.

3. The power supply unit of claim 2 wherein the first predetermined duration is at least 5 times as long as the second predetermined duration.

4. The power supply unit of claim 1 wherein the control circuitry is configured to periodically automatically perform a self-test to determine if the differential current between the live and neutral conductive paths exceeds the threshold.

5. The power supply unit of claim 1 further comprising a breaker on the live conductive path, the breaker being configured to trip and cause an open circuit on the live conductive path when the current travelling through the live conductive path exceeds a trip threshold.

6. The power supply unit of claim 1, further comprising a surge protector connected between the live conductor and neutral conductor, the surge protector configured to limit the maximum voltage between the live conductor and neutral conductor by shorting to ground any voltage over a desired threshold.

7. The power supply unit of claim 1 further comprising a counter circuit which resets the control circuitry a predetermined time after the failure is signaled.

8. The power supply unit of claim 1 further comprising a fault LED that indicates when the control circuitry signals the failure.

9. The power supply unit of claim 1 further comprising a fault LED that indicates when both the control circuitry signals the failure and current flow has been stopped on the live conductive path.

10. A power supply unit, comprising:
a main power input for connecting to an AC power source;

a power output for providing AC power;

live and neutral conductive paths connecting the power input to the power output, including a relay between the power input and power output;

a current sensor for sensing a differential current between the live and neutral conductive paths; and control circuitry operatively connected to the relay and the current sensor, the control circuitry being configured to: upon detecting that the differential current between the live and neutral conductive paths exceeds a threshold, cause the relay to stop current flow from the main power input to the power output for a first predetermined duration after which the relay automatically allows current flow from the main power input to the power output to resume, further comprising a jumper output for providing AC power, the jumper output being connected to the live and neutral conductive paths between the main power input and the relay, wherein the jumper output continues to receive current flow when the relay stops current flow from the main power input to the power output.

11. The power supply unit of claim 1, further comprising an AC to DC power supply circuit connected to the live and neutral conductive paths, wherein the AC to DC power supply circuit supplies DC power to the control circuitry.

12. The power supply unit of claim 11, further comprising:

one or more DC power outputs;

one or more legacy USB controllers which receive power from the AC to DC power supply circuit and supply DC power to the one or more DC power outputs.

13. The power supply unit of claim 12, further comprising one or more USB-C controllers which receive power from the AC to DC power supply circuit and supply power to the one or more DC power output.

14. The power supply unit of claim 13, further comprising a power adjustment circuit, wherein there are two or more DC power outputs and the power adjustment circuit limits the power supplied by the one or more USB-C controllers when power is being supplied to two or more DC power outputs by the one or more USB-C controllers simultaneously.

15. A power supply unit, further comprising:

power supply unit comprising a main power input for connecting to an AC power source;

a power output for providing AC power;

live and neutral conductive paths connecting the power input to the power output, including a relay between the power input and power output;

a current sensor for sensing a differential current between the live and neutral conductive paths;

control circuitry operatively connected to the relay and the current sensor, the control circuitry being configured to: upon detecting that the differential current between the live and neutral conductive paths exceeds a threshold, cause the relay to stop current flow from the main power input to the power output for a first predetermined duration after which the relay automatically allows current flow from the main power input to the power output to resume;

a rigid casing;

one or more openings in the rigid case; and one or more modular inserts that can be fitted into corresponding openings;

wherein the modular inserts support different plug receptacle configurations and are in electric communication with the power output when inserted into corresponding openings.

* * * * *